US012394596B2

(12) United States Patent
Cui et al.

(10) Patent No.: US 12,394,596 B2
(45) Date of Patent: *Aug. 19, 2025

(54) PLASMA UNIFORMITY CONTROL IN PULSED DC PLASMA CHAMBER

(71) Applicant: Applied Materials, Inc., Santa Clara, CA (US)

(72) Inventors: Linying Cui, Cupertino, CA (US); James Rogers, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 744 days.

This patent is subject to a terminal disclaimer.

(21) Appl. No.: 17/537,270

(22) Filed: Nov. 29, 2021

(65) Prior Publication Data

US 2022/0399193 A1    Dec. 15, 2022

Related U.S. Application Data

(60) Provisional application No. 63/208,913, filed on Jun. 9, 2021.

(51) Int. Cl.
*H01J 37/32* (2006.01)
(52) U.S. Cl.
CPC .. *H01J 37/32128* (2013.01); *H01J 37/32091* (2013.01); *H01J 37/32146* (2013.01);
(Continued)
(58) Field of Classification Search
None
See application file for complete search history.

(56) References Cited

U.S. PATENT DOCUMENTS

| 4,070,589 A | 1/1978 | Martinkovic |
| 4,340,462 A | 7/1982 | Koch |

(Continued)

FOREIGN PATENT DOCUMENTS

| CN | 101707186 B | 2/2012 |
| CN | 106206234 A | 12/2016 |

(Continued)

OTHER PUBLICATIONS

Wang, S.B., et al.—"Control of ion energy distribution at substrates during plasma processing," Journal of Applied Physics, vol. 88, No. 2, Jul. 15, 2000, pp. 643-646.

(Continued)

*Primary Examiner* — Karla A Moore
(74) *Attorney, Agent, or Firm* — Patterson + Sheridan, LLP

(57) ABSTRACT

Embodiments provided herein generally include apparatus, e.g., plasma processing systems and methods for the plasma processing of a substrate in a processing chamber. In some embodiments, aspects of the apparatus and methods are directed to improving process uniformity across the surface of the substrate, reducing defectivity on the surface of the substrate, or both. In some embodiments, the apparatus and methods provide for improved control over the uniformity of a plasma formed over the edge of a substrate and/or the distribution of ion energies at the surface of the substrate. The improved control over the plasma uniformity may be used in combination with substrate handling methods, e.g., de-chucking methods, to reduce particulate-related defectivity on the surface of the substrate. In some embodiments, the improved control over the plasma uniformity is used to preferentially clean accumulated processing byproducts from portions of the edge ring during an in-situ plasma chamber cleaning process.

23 Claims, 13 Drawing Sheets

(52) U.S. Cl.
CPC .... *H01J 37/32183* (2013.01); *H01J 37/3244* (2013.01); *H01J 37/32568* (2013.01); *H01J 37/32642* (2013.01); *H01J 37/32724* (2013.01); *H01J 37/32862* (2013.01); *H01J 2237/334* (2013.01)

(56) References Cited

U.S. PATENT DOCUMENTS

| | | |
|---|---|---|
| 4,464,223 A | 8/1984 | Gorin |
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 7,016,620 B2 | 3/2006 | Maess et al. |
| 7,046,088 B2 | 5/2006 | Ziegler |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,312,974 B2 | 12/2007 | Kuchimachi |
| 7,415,940 B2 | 8/2008 | Koshimizu et al. |
| 7,479,712 B2 | 1/2009 | Richert et al. |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,133,347 B2 | 3/2012 | Gluck et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |

(56) References Cited

U.S. PATENT DOCUMENTS

| | | |
|---|---|---|
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,139,910 B2 | 9/2015 | Lee et al. |
| 9,147,555 B2 | 9/2015 | Richter |
| 9,150,960 B2 | 10/2015 | Nauman et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,228,878 B2 | 1/2016 | Haw et al. |
| 9,254,168 B2 | 2/2016 | Palanker |
| 9,287,086 B2 | 3/2016 | Brouk et al. |
| 9,287,092 B2 | 3/2016 | Brouk et al. |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,564,287 B2 | 2/2017 | Ohse et al. |
| 9,576,810 B2 | 2/2017 | Deshmukh et al. |
| 9,576,816 B2 | 2/2017 | Rastogi et al. |
| 9,593,421 B2 | 3/2017 | Baek et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,728,429 B2 | 8/2017 | Ricci et al. |
| 9,741,544 B2 | 8/2017 | Van Zyl |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,840,770 B2 | 12/2017 | Klimczak et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,872,373 B1 | 1/2018 | Shimizu et al. |
| 9,881,820 B2 | 1/2018 | Wong et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,960,763 B2 | 5/2018 | Miller et al. |
| 9,972,503 B2 | 5/2018 | Tomura et al. |
| 10,020,800 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,387,166 B2 | 8/2019 | Preston et al. |
| 10,388,544 B2 | 8/2019 | Ui et al. |
| 10,410,877 B2 | 9/2019 | Takashima et al. |
| 10,431,437 B2 | 10/2019 | Gapi70nski et al. |
| 10,438,797 B2 | 10/2019 | Cottle et al. |
| 10,446,453 B2 | 10/2019 | Coppa et al. |

(56) References Cited

U.S. PATENT DOCUMENTS

| | | | |
|---|---|---|---|
| 10,447,174 B1 | 10/2019 | Porter, Jr. et al. |
| 10,460,910 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,593,519 B2 | 3/2020 | Yamada et al. |
| 10,607,814 B2 | 3/2020 | Ziemba et al. |
| 10,658,189 B2 | 5/2020 | Hatazaki et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,862 B2* | 6/2020 | Rogers .............. H01J 37/32568 |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,714,372 B2 | 7/2020 | Chua et al. |
| 10,720,305 B2 | 7/2020 | Van Zyl |
| 10,748,746 B2 | 8/2020 | Kaneko et al. |
| 10,755,894 B2 | 8/2020 | Hirano et al. |
| 10,763,081 B2* | 9/2020 | Cui .................. H01J 37/32642 |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,790,816 B2 | 9/2020 | Ziemba et al. |
| 10,796,887 B2 | 10/2020 | Prager et al. |
| 10,804,886 B2 | 10/2020 | Miller et al. |
| 10,811,296 B2 | 10/2020 | Cho et al. |
| 10,892,141 B2 | 1/2021 | Ziemba et al. |
| 10,896,807 B2 | 1/2021 | Fairbairn et al. |
| 10,903,047 B2 | 1/2021 | Ziemba et al. |
| 10,904,996 B2 | 1/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,108,384 B2 | 8/2021 | Prager et al. |
| 11,791,138 B2* | 10/2023 | Cui .................. H01J 37/32174 216/61 |
| 11,948,780 B2* | 4/2024 | Cui .................. H01J 37/32715 |
| 12,148,595 B2* | 11/2024 | Cui .................. H01J 37/32146 |
| 2001/0003298 A1 | 6/2001 | Shamouilian et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0223284 A1 | 11/2004 | Iwami et al. |
| 2005/0022933 A1 | 2/2005 | Howard |
| 2005/0092596 A1 | 5/2005 | Kouznetsov |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0284344 A1 | 12/2007 | Todorov et al. |
| 2007/0285869 A1 | 12/2007 | Howald |
| 2008/0012548 A1 | 1/2008 | Gerhardt et al. |
| 2008/0037196 A1 | 2/2008 | Yonekura et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0078678 A1 | 3/2009 | Kojima et al. |
| 2009/0133839 A1 | 5/2009 | Yamazawa et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0101935 A1 | 4/2010 | Chistyakov et al. |
| 2010/0118464 A1 | 5/2010 | Matsuyama |
| 2010/0193491 A1 | 8/2010 | Cho et al. |
| 2010/0271744 A1 | 10/2010 | Ni et al. |
| 2010/0326957 A1 | 12/2010 | Maeda et al. |
| 2011/0031217 A1* | 2/2011 | Himori .............. H01J 37/32091 156/345.48 |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0164834 A1* | 6/2012 | Jennings .......... H01J 37/32541 118/723 R |
| 2013/0059448 A1 | 3/2013 | Marakhtanov et al. |
| 2013/0087447 A1 | 4/2013 | Bodke et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0077611 A1 | 3/2014 | Young et al. |
| 2014/0109886 A1 | 4/2014 | Singleton et al. |
| 2014/0154819 A1 | 6/2014 | Gaff et al. |
| 2014/0177123 A1 | 6/2014 | Thach et al. |
| 2014/0238844 A1 | 8/2014 | Chistyakov |
| 2014/0263182 A1 | 9/2014 | Chen et al. |
| 2014/0273487 A1 | 9/2014 | Deshmukh et al. |
| 2015/0002018 A1 | 1/2015 | Lill et al. |
| 2015/0043123 A1 | 2/2015 | Cox |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0170952 A1 | 6/2015 | Subramani et al. |
| 2015/0235809 A1 | 8/2015 | Ito et al. |
| 2015/0315698 A1 | 11/2015 | Chistyakov |
| 2015/0366004 A1 | 12/2015 | Nangoy et al. |
| 2016/0004475 A1 | 1/2016 | Beniyama et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0241234 A1 | 8/2016 | Mavretic |
| 2016/0284514 A1 | 9/2016 | Hirano et al. |

(56) References Cited

U.S. PATENT DOCUMENTS

| | | |
|---|---|---|
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0115657 A1 | 4/2017 | Trussell et al. |
| 2017/0162417 A1 | 6/2017 | Ye et al. |
| 2017/0169996 A1 | 6/2017 | Ui et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0250056 A1 | 8/2017 | Boswell et al. |
| 2017/0263478 A1 | 9/2017 | McChesney et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2018/0076032 A1 | 3/2018 | Wang et al. |
| 2018/0139834 A1 | 5/2018 | Nagashima et al. |
| 2018/0190501 A1 | 7/2018 | Ueda |
| 2018/0204708 A1 | 7/2018 | Tan et al. |
| 2018/0218905 A1 | 8/2018 | Park et al. |
| 2018/0226896 A1 | 8/2018 | Miller et al. |
| 2018/0294566 A1 | 10/2018 | Wang et al. |
| 2018/0309423 A1 | 10/2018 | Okunishi et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0006156 A1 | 1/2019 | Seo et al. |
| 2019/0027344 A1 | 1/2019 | Okunishi et al. |
| 2019/0090338 A1 | 3/2019 | Koh et al. |
| 2019/0096633 A1 | 3/2019 | Pankratz et al. |
| 2019/0157042 A1* | 5/2019 | Van Zyl ............ H01J 37/32697 |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0267218 A1 | 8/2019 | Wang et al. |
| 2019/0277804 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348263 A1 | 11/2019 | Okunishi |
| 2019/0350072 A1* | 11/2019 | Dorf ........................ H05H 1/46 |
| 2019/0363388 A1 | 11/2019 | Esswein et al. |
| 2019/0385822 A1 | 12/2019 | Marakhtanov et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0051785 A1 | 2/2020 | Miller et al. |
| 2020/0058475 A1 | 2/2020 | Engelstaedter et al. |
| 2020/0066497 A1 | 2/2020 | Engelstaedter et al. |
| 2020/0075293 A1 | 3/2020 | Ventzek et al. |
| 2020/0106137 A1 | 4/2020 | Murphy et al. |
| 2020/0126837 A1 | 4/2020 | Kuno et al. |
| 2020/0144030 A1 | 5/2020 | Prager et al. |
| 2020/0161098 A1 | 5/2020 | Cui et al. |
| 2020/0161155 A1 | 5/2020 | Rogers et al. |
| 2020/0227230 A1 | 7/2020 | Ziemba et al. |
| 2020/0227238 A1 | 7/2020 | Kellogg et al. |
| 2020/0243303 A1 | 7/2020 | Mishra et al. |
| 2020/0251371 A1 | 8/2020 | Kuno et al. |
| 2020/0266035 A1 | 8/2020 | Nagaiwa |
| 2020/0343123 A1 | 10/2020 | Ye et al. |
| 2020/0357607 A1 | 11/2020 | Ziemba et al. |
| 2020/0373114 A1 | 11/2020 | Prager et al. |
| 2020/0407840 A1 | 12/2020 | Hayashi et al. |
| 2020/0411286 A1 | 12/2020 | Koshimizu et al. |
| 2021/0013006 A1 | 1/2021 | Nguyen et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0249227 A1 | 8/2021 | Bowman et al. |

FOREIGN PATENT DOCUMENTS

| | | |
|---|---|---|
| CN | 104752134 B | 2/2017 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 4418424 B2 | 2/2010 |
| JP | 2011035266 A | 2/2011 |
| JP | 5018244 B2 | 9/2012 |
| JP | 6741461 B2 | 8/2020 |
| KR | 20210002181 A | 1/2021 |
| WO | 2000017920 A1 | 3/2000 |
| WO | 2002059954 A1 | 8/2002 |
| WO | 2008050619 A1 | 5/2008 |
| WO | 2014124857 A3 | 5/2015 |
| WO | 2015198854 A1 | 12/2015 |
| WO | 2016002547 A1 | 1/2016 |
| WO | 2016131061 A1 | 8/2016 |
| WO | 2019036587 A1 | 2/2019 |
| WO | 2019185423 A1 | 10/2019 |
| WO | 2019225184 A1 | 11/2019 |
| WO | 2019239872 A1 | 12/2019 |
| WO | 2019245729 A1 | 12/2019 |
| WO | 2020004048 A1 | 1/2020 |
| WO | 2020017328 A1 | 1/2020 |
| WO | 2020051064 A1 | 3/2020 |
| WO | 2020121819 A1 | 6/2020 |
| WO | 2022108754 A1 | 5/2022 |

OTHER PUBLICATIONS

Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.

Eagle Harbor Technologies presentation by Dr. Kenneth E. Miller—"The EHT Long Pulse Integrator Program," TPA Diagnostic Meeting, General Atomics, Jun. 4-7, 2013, 18 pages.

Fagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

Eagle Harbor Technologies webpage—"High Gain and Frequency Ultra-Stable Integrators for Long Pulse and/or High Current Applications, 2018, 1 page.

Eagle Harbor Technologies webpage—"In Situ Testing of EHT Integrators on a Tokamak," 2015, 1 page.

Eagle Harbor Technologies webpage—"Long-Pulse Integrator Testing with DIII-D Magnetic Diagnostics," 2016, 1 page.

Lin, Jianliang, et al.,—"Diamond like carbon films deposited by HiPIMS using oscillatory voltage pulses," Surface & Coatings Technology 258, 2014, published by Elsevier B.V., pp. 1212-1222.

Prager, J.R. et al, A High Voltage Nanosecond Pulser With Variable Pulse Width and Pulse Repetition Frequency Control for Nonequilibrium Plasma Applications, IEEE 2014, 6 pages.

Semiconductor Components Industries, LLC (SCILLC)—"Switch-Mode Power Supply" Reference Manual, SMPSRM/D, Rev. 4, Apr. 2014, on Semiconductor, 73 pages.

(56) References Cited

OTHER PUBLICATIONS

Sunstone Circuits—"Eagle Harbor Tech Case Study," date unknown, 4 pages.

Electrical 4 U webpage—"Clamping Circuit," Aug. 29, 2018, 1 page.

Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.

Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.

S.B. Wang et al. "Ion Bombardment Energy and SiO 2/Si Fluorocarbon Plasma Etch Selectivity", Journal of Vacuum Science & Technology A 19, 2425 (2001).

Zhen-hua Bi et al., A brief review of dual-frequency capacitively coupled discharges, Current Applied Physics, vol. 11, Issue 5, Supplement, 2011, pp. S2-S8.

Chang, Bingdong, "Oblique angled plasma etching for 3D silicon structures with wiggling geometries" 31(8), [085301]. https://doi.org/10.1088/1361-6528/ab53fb. DTU Library. 2019.

Michael A. Lieberman, "A short course of the principles of plasma discharges and materials processing", Department of Electrical Engineering and Computer Sciences University of California, Berkeley, CA 94720.

Dr. Steve Sirard, "Introduction to Plasma Etching", Lam Research Corporation. 64 pages.

Zhuoxing Luo, B.S., M.S, "RF Plasma Etching With A DC Bias" A Dissertation in Physics. Dec. 1994.

Michael A. Lieberman, "Principles of Plasma Discharges and Material Processing", A Wiley Interscience Publication. 1994.

Yiting Zhang et al. "Investigation of feature orientation and consequences of ion tilting during plasma etching with a three-dimensional feature profile simulator", Nov. 22, 2016.

Richard Barnett et al. A New Plasma Source for Next Generation MEMS Deep Si Etching: Minimal Tilt, Improved Profile Uniformity and Higher Etch Rates, SPP Process Technology Systems. 2010.

International Search Report and Written Opinion for PCT/US2022/029257 dated Aug. 31, 2022.

\* cited by examiner

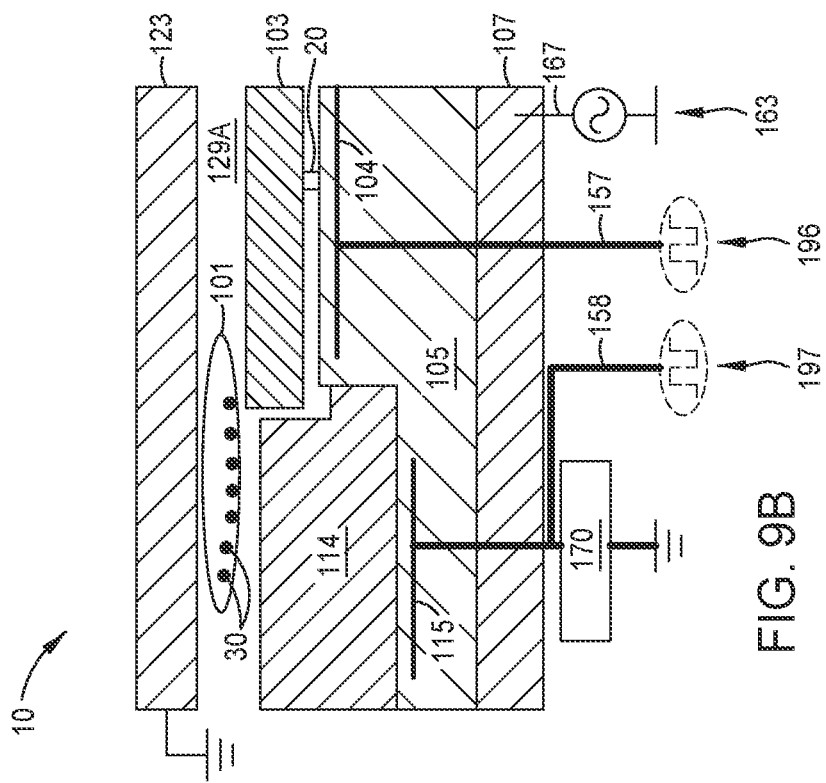
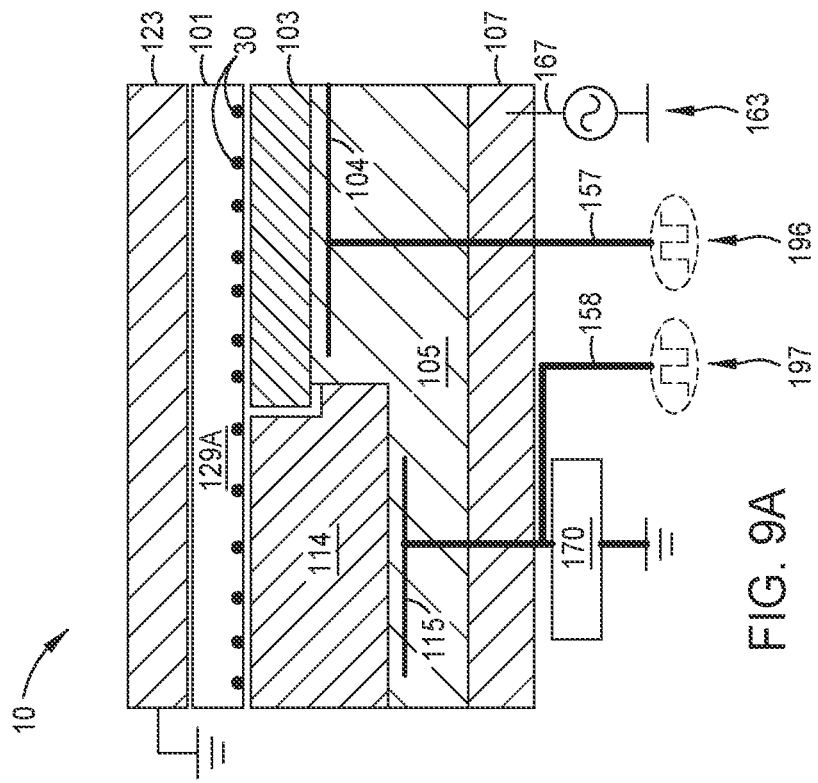

PLASMA UNIFORMITY CONTROL IN PULSED DC PLASMA CHAMBER

CROSS-REFERENCE TO RELATED APPLICATIONS

This application claims the benefit of U.S. Provisional Application 63/208,913 filed on Jun. 9, 2021, which is incorporated by reference herein.

BACKGROUND

Field

Embodiments herein are directed to plasma-generating gas or vapor electric space discharge devices used in semiconductor device manufacturing, particularly processing chambers configured to generate a capacitively coupled plasma of gas or vapor material supplied to a chamber volume and process a semiconductor substrate therein.

Description of the Related Art

Reliably producing high aspect ratio features is one of the key technology challenges for the next generation of semiconductor devices. One method of forming high aspect ratio features uses a plasma-assisted etching process, such as a reactive ion etch (RIE) process, to transfer openings in a masking layer to exposed portions of a substrate surface there below.

In a typical plasma-assisted etching process, the substrate is positioned on a substrate support, such as an electrostatic chuck (ESC) disposed in a processing chamber, a plasma is formed over the substrate, and ions are accelerated from the plasma towards the substrate across a plasma sheath, i.e., region depleted of electrons, formed between the plasma and the surface of the substrate. Openings in the mask layer are transferred to the substrate surface through a combination of chemical and physical interactions with plasma-generated neutrals and impinging ions that provide the anisotropic etch. Processing results at the substrate surface depend on, inter alia, characteristics of the plasma and plasma sheath formed there above.

Often, the plasma chamber is configured to form a capacitively coupled plasma and control the plasma sheath by use of two or more radio frequency (RF) powers. For example, a high-frequency component may be used to ignite and maintain the plasma, which determines the plasma density and thus the ion flux at the substrate surface, while a lower frequency component may be used to control a voltage drop across the plasma sheath.

Unfortunately, non-uniformities in the plasma density and/or in the shape of the plasma sheath can cause undesirable processing result variation (non-uniform process results from substrate center to edge) in etched feature profile. Excessive processing non-uniformity may adversely affect and suppress device yield (the percentage of devices that conform to performance specifications out of the total number of devices manufactured on the substrate). Such non-uniformities are often particularly pronounced near the substrate edge and may be caused by inter alia, non-uniform power distribution, changes in chamber geometries, differences in surface material properties, and/or electrical discontinuities between the edge of the substrate and surfaces of the ESC disposed proximate thereto.

Further, undesired processing byproducts often accumulate on surfaces of chamber components, such as in a gap between the edge of the substrate and an edge ring that surrounds the substrate during processing. The accumulated processing byproducts may transfer to the bevel edge of the substrate and/or may cause undesired arcing between the bevel edge of the substrate and the edge ring, further suppressing device yield and/or reducing chamber productivity.

Accordingly, there is a need in the art for apparatus and methods to improve processing uniformity and defectivity at the edge of a substrate during plasma-assisted processing thereof. There is also a need for a system, device(s), and methods that solve the problems described above.

SUMMARY

Embodiments provided herein generally include apparatus, e.g., plasma processing systems, and methods for the plasma processing of a substrate in a processing chamber. In some embodiments, aspects of the apparatus and methods are directed to improving processing uniformity across the surface of the substrate, reducing defectivity on the surface of the substrate, or both.

In one embodiment, a plasma processing system includes a substrate support assembly, that may include: a support base; a first electrode that is disposed over the support base and is spaced apart from the support base by a first portion of dielectric material; a second portion of dielectric material disposed over the first electrode, the second portion of dielectric material forming a substrate supporting surface; and a second electrode that is disposed a distance from a center of the first electrode and is spaced apart from the support base by a third portion of dielectric material; one or more pulsed voltage waveform generators electrically coupled to the first and second electrodes; a radio frequency (RF) generator electrically coupled to the support base, where the RF generator is configured to deliver an RF signal to the support base, and the RF signal establishes a first RF waveform at the first electrode; and an edge tuning circuit electrically coupled to the second electrode, where the edge tuning circuit is configured to adjust one or more characteristics of a second RF waveform established at the second electrode relative to one or more characteristics of the first RF waveform established at the first electrode.

In one embodiment, a plasma processing system includes a processing chamber that may include a chamber lid, one or more chamber walls, and a substrate support assembly that collectively define a processing region, the substrate support assembly may include: a support base; a first electrode that is disposed over the support base and is spaced apart from the support base by a first portion of dielectric material; a second portion of dielectric material disposed over the first electrode, the second portion of dielectric material forming a substrate supporting surface; and a second electrode that is disposed a distance from a center of the first electrode and is spaced apart from the support base by a third portion of dielectric material; a radio frequency (RF) generator electrically coupled to the support base, where the RF generator is configured to deliver an RF signal to the support base, the RF signal is configured to ignite and maintain a plasma or gases or vapors delivered to the processing region, and the RF signal establishes a first RF waveform at the first electrode; and an edge tuning circuit electrically coupled to the second electrode, where the edge tuning circuit is configured to adjust one or more characteristics of a second RF waveform established at the second electrode relative to one or more characteristics of the first RF waveform established at the first electrode.

In one embodiment, a processing method includes (i) generating, by use of a radio frequency (RF) signal from an RF generator, a plasma of gases or vapors delivered to a processing region defined by a chamber lid and a substrate support assembly, the substrate support assembly may include: a support base that is electrically coupled to the RF generator; a first electrode that is disposed over the support base and is spaced apart from the support base by a first portion of dielectric material, where the RF signal establishes a first RF waveform at the first electrode; a second portion of dielectric material disposed over the first electrode, the second portion of dielectric material forming a substrate supporting surface; and a second electrode that is disposed a distance from a center of the first electrode, is spaced apart from the support base by a third portion of dielectric material, and is electrically coupled to an edge tuning circuit; and (ii) establishing, by use of the RF signal and the tuning circuit, a second RF waveform at the second electrode, where one or more characteristics of the first RF waveform are different from characteristics of the second RF waveform.

Other embodiments include corresponding computer systems, apparatus, and computer programs recorded on one or more computer storage devices, each configured to perform the actions of the methods.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

FIGS. 9A-9D are schematic sectional views of a portion of a plasma processing system, according to one embodiment, that illustrate aspects of the methods set forth in FIGS. 8A-8C.

DETAILED DESCRIPTION

Figure 1A:
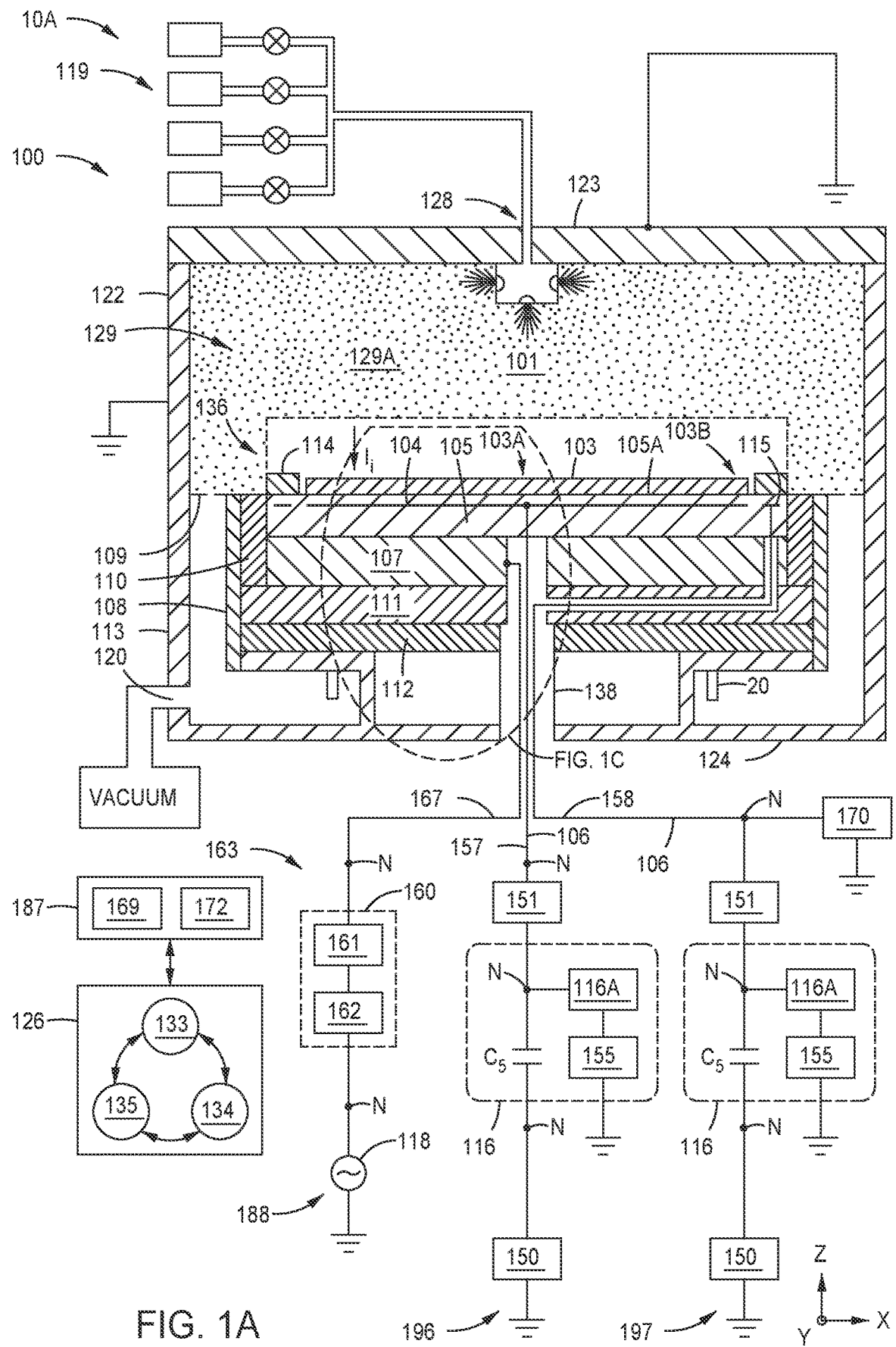
FIG. 1A-1B are schematic cross-sectional views of processing systems, according to one or more embodiments, configured to practice the methods set forth herein.

Embodiments provided herein include apparatus and methods for the plasma processing of a substrate in a processing chamber. In some embodiments, aspects of the apparatus and methods are directed to improving process uniformity across the surface of the substrate, reducing defectivity on the surface of the substrate, or both. In some embodiments, the apparatus and methods provide for improved control over the uniformity of a plasma formed over the edge of a substrate and/or the distribution of ion energies at the surface of the substrate. In some embodiments, the improved control over the plasma uniformity is used in combination with substrate handling methods, e.g., de-chucking methods, to reduce particulate-related defectivity on the surface of the substrate. In some embodiments, the improved control over the plasma uniformity is used to preferentially clean accumulated processing byproducts from portions of the edge ring during an in-situ plasma chamber cleaning process.

Embodiments of the disclosure may include an apparatus and method for providing a pulsed-voltage (PV) waveform delivered from one or more pulsed-voltage (PV) generators to a plurality of electrodes within the processing chamber while biasing and clamping a substrate during a plasma process. In some embodiments, a radio frequency (RF) generated RF waveform is provided from an RF generator to one or more power electrodes within the processing chamber to establish and maintain a plasma within the processing chamber, while PV waveform(s) delivered from the one or more PV generators are configured to establish a nearly constant sheath voltage (e.g., a constant difference between the plasma potential and the substrate potential) across the surface of the substrate and surfaces of the substrate support assembly adjacent thereto. The established nearly constant sheath voltage provides a desirable ion energy distribution function (IEDF) at the surface of the substrate during the one or more plasma processing operations performed within the processing chamber.

Some embodiments of the disclosure include an apparatus and method for controlling plasma uniformity, e.g., by controlling electron density in the bulk plasma over the circumferential edge region of the substrate and adjacent surfaces of the substrate support assembly relative to the center of the substrate. In some embodiments, the plasma uniformity is controlled using an edge tuning circuit to control one or a combination of a voltage amplitude ratio between an RF waveform established at an edge control electrode and an RF waveform established at the bias electrode, a current amplitude ratio between the RF waveforms at the edge control electrode and the bias electrode, and a phase difference between the RF waveforms at the respective electrodes.

Beneficially, the apparatus and methods may be used alone or in combination to provide individual tuning knobs for controlling reactive neutral species concentration, ion energy and angular distribution, ion directionality and directionality uniformity and separately controlling ion flux and/or reactive neutral species uniformity across the surface of the substrate, such as at the edge of the substrate. For example, in some embodiments, ion energy, and directionality uniformity may be controlled by adjusting PV waveforms established at the edge electrode and the chucking electrode, respectively so to control the thickness profile of the plasma sheath and the shape of a sheath boundary (between the plasma sheath and the plasma) that is formed over the edge regions of the substrate and thus the energy and directionality of ions accelerated towards the substrate surface. Ion flux and/or reactive neutral species concentration uniformity may be separately controlled by adjusting the RF waveforms established at the respective electrodes. Generally, ion energy and directionality influence processing results related to ion interaction at the substrate surface, such as the etch profile in feature openings formed in the surface of the substrate, while ion flux and reactive neutral species concentration strongly influences processing rates, such as the rate of material removal from the feature openings. Thus, the ability to separately control ion energy, ion directionality, and ion flux and reactive neutral species at the processing surface provides desirable tuning parameters which may be used to optimize both the etching profiles needed for the tight tolerances for the next generation of electronic devices as well as processing throughput needed for cost-efficient manufacturing thereof.

Plasma Processing System Examples

Figure 1B:
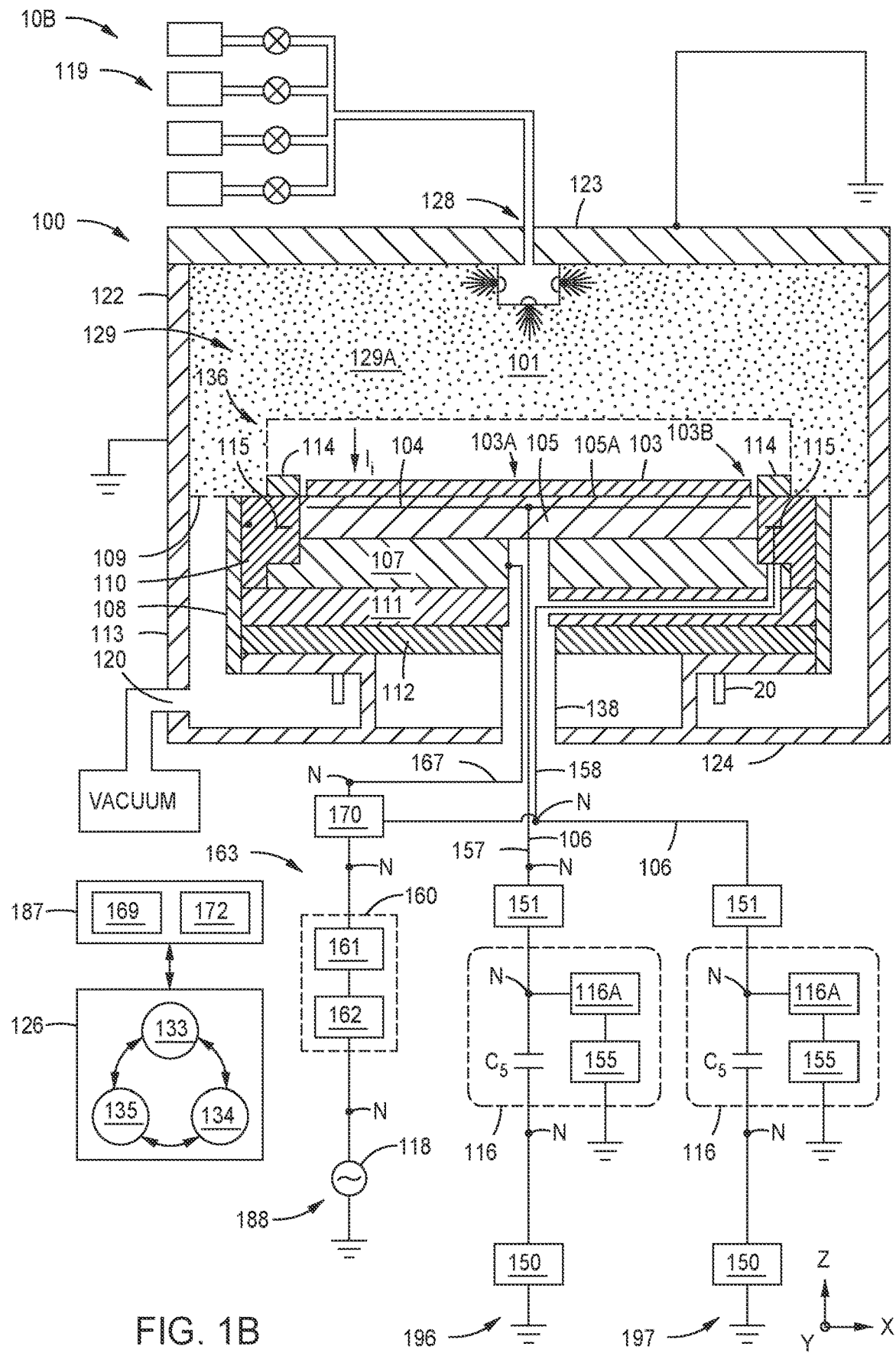
Figure 2:
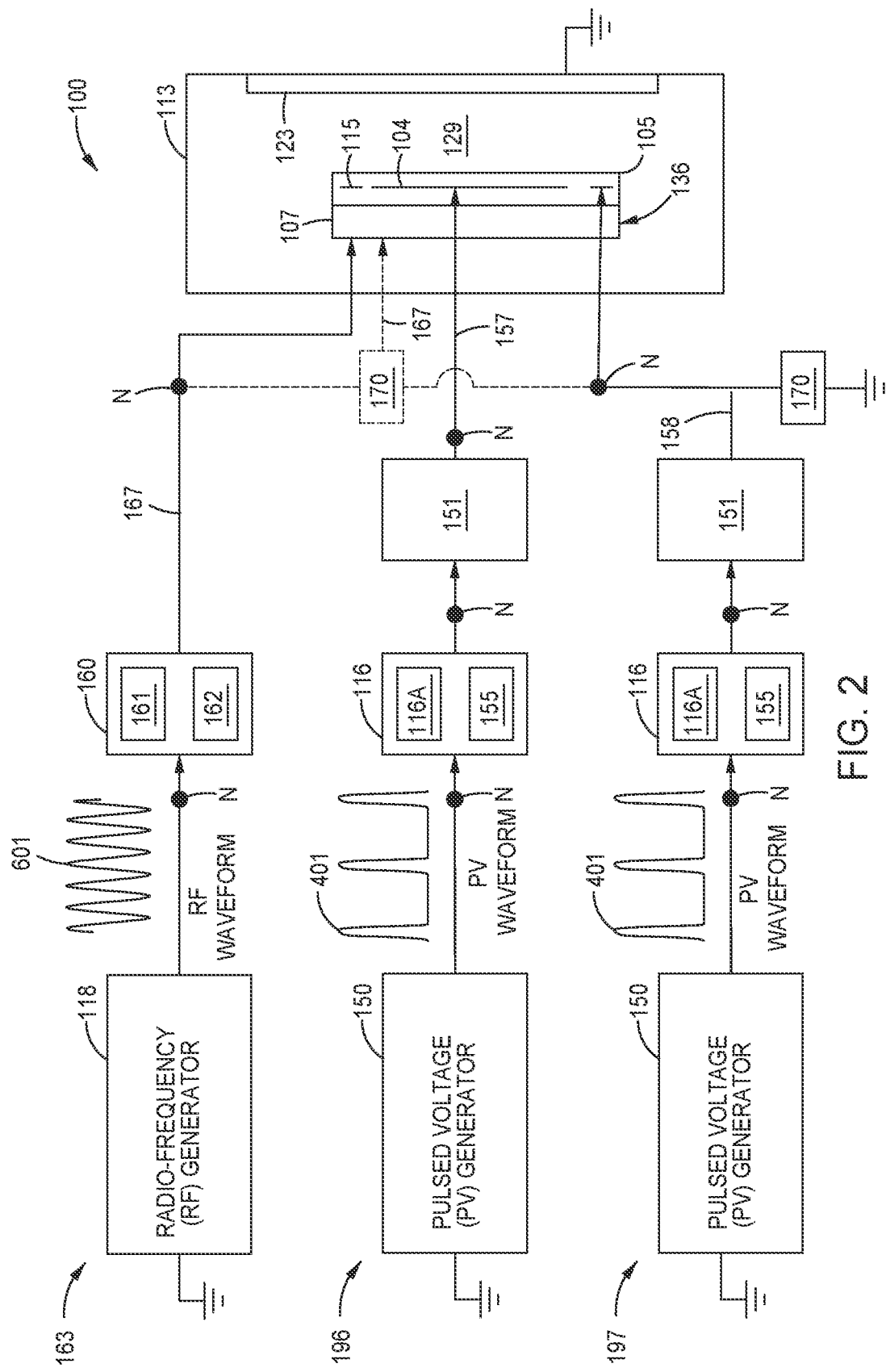
FIG. 2 is a simplified schematic diagram of a biasing and edge control scheme that can be used with one or both of the processing systems illustrated in FIGS. 1A-1B, according to one or more embodiments.
Figure 3B:
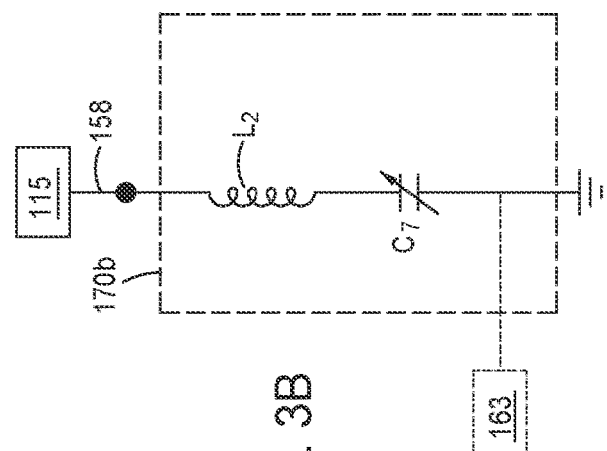
FIGS. 3A-3C schematically illustrate example edge tuning circuits that can be used with one or both of the processing systems illustrated in FIGS. 1A-1B, according to one or more embodiments.
Figure 3A:
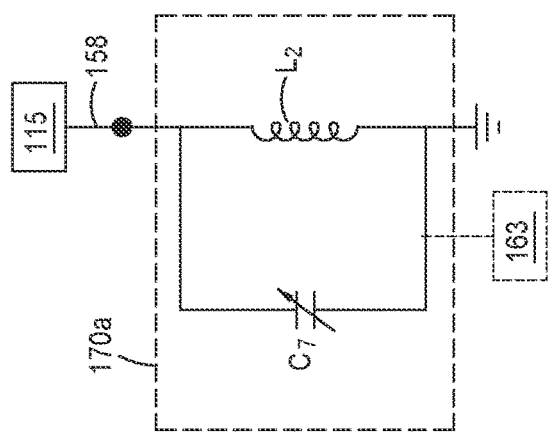
Figure 3C:
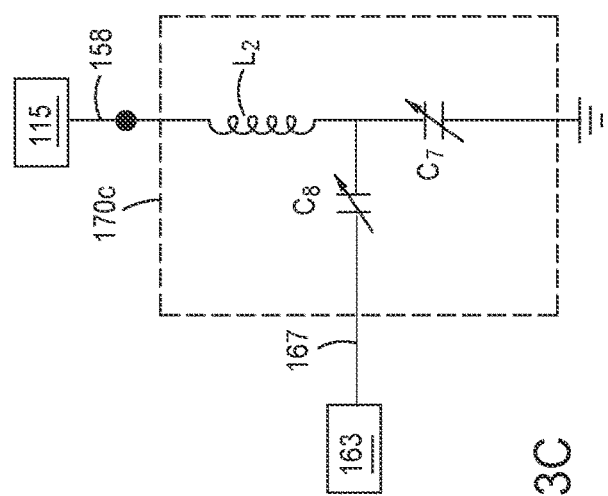

FIGS. 1A and 1B are schematic cross-sectional views of respective processing systems 10A and 10B configured to perform one or more of the plasma processing methods set forth herein. FIG. 2 is a simplified schematic diagram of a processing scheme that can be used with one or both of the processing systems 10A and 10B. FIGS. 3A-3C are examples of edge tuning circuits 170a, 170b, 170c that can be used as the edge tuning circuit 170 with one or both of the processing systems 10A and 10B to control and adjust plasma uniformity.

In some embodiments, the processing systems 10A and 10B illustrated in FIGS. 1A and 1B are configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown in FIGS. 1A-1B, the processing systems 10A-10B are configured to form a capacitively coupled plasma (CCP), where the processing chamber 100 include an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source (e.g., RF generator 118) is electrically coupled to one of the upper or lower electrode delivers an RF signal configured to ignite and maintain a plasma (e.g., the plasma 101), which is capacitively coupled to each of the upper and lower electrodes and is disposed in a processing region therebetween. Typically, the opposing one of the upper or lower electrodes is coupled to ground or to a second RF power source. In FIGS. 1A-1B, one or more components of the substrate support assembly 136, such as the support base 107, is electrically coupled to a plasma generator assembly 163, which includes the RF generator 118, and the chamber lid 123 is electrically coupled to ground.

As shown in FIGS. 1A-1B, each of the processing systems 10A and 10B includes a processing chamber 100, a substrate support assembly 136, a system controller 126, and a plasma control scheme 18. It is contemplated that in embodiments described herein that any one of or combination of the features, configurations, and/or structural components of the processing system 10A, e.g., the structural components of the substrate support assembly 136 and/or electrical components of the plasma control scheme 18, may be used in the processing system 10B, and vice versa.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases or vapors to the processing volume 129 from a processing gas source 119 that is in fluid communication therewith. In some embodiments, the chamber lid 123 includes a showerhead (not shown), and gases or vapors are distributed into the processing volume through the showerhead. In some embodiments, the gas or vapors are delivered to the processing volume 129 using a gas inlet disposed through one of the one or more sidewalls 122 (not shown). A substrate 103 is loaded into, and removed from, the processing volume 129 through an opening (not shown) in one of the one or more sidewalls 122, which is sealed with a slit valve (not shown) during plasma processing of the substrate 103.

In some embodiments, a plurality of lift pins 20 movably disposed through openings formed in the substrate support assembly 136 is used to facilitate substrate transfer to and from a substrate supporting surface 105A. In some embodiments, the plurality of lift pins 20 are disposed above and are coupled to and/or are engageable with a lift pin hoop (not shown) disposed in the processing volume 129. The lift pin hoop may be coupled to a shaft (not shown) that sealingly extends through the chamber base 124. The shaft may be coupled to an actuator (not shown) that is used to raise and lower the lift pin hoop. When the lift pin hoop is in a raised position, it engages with the plurality of lift pins 20 to raise the upper surfaces of the lift pins above the substrate supporting surface 105A, lifting the substrate 103 therefrom and enabling access to a non-active (backside) surface the substrate 103 by a robot handler (not shown). When the lift pin hoop is in a lowered position, the plurality of lift pins 20 are flush with or recessed below the substrate supporting surface 105A, and the substrate 103 rests thereon.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10A and/or 10B.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10A and/or 10B to perform the various process tasks and various process sequences used to implement the methods described herein. In one embodiment, the program includes instructions that are used to perform one or more of the operations described below in relation to FIGS. 7 and 8A-8B.

The plasma control scheme 188 illustrated in FIGS. 1A-1B generally includes a plasma generator assembly 163, a first pulsed voltage (PV) source assembly 196 for establishing a first PV waveform at a bias electrode 104, and a second PV source assembly 197 for establishing a second PV waveform at an edge control electrode 115. In some embodiments, the plasma generator assembly 163 delivers an RF signal to the support base 107 (e.g., power electrode or cathode), which may be used to generate (maintain and/or ignite) a plasma 101 in a processing region disposed between the substrate support assembly 136 and the chamber lid 123. In some embodiments, the RF generator 118 is configured to deliver an RF signal having a frequency that is greater than 400 kHz, such as an RF frequency of about 1 MHz or more, or about 2 MHz or more, such as about 13.56 MHz or more, about 27 MHz or more, about 40 MHz or more, or, for example, between about 30 MHz and about 200 MHz, such as between about 30 MHz and about 160 MHz, between about 30 MHz and about 120 MHz, or between about 30 MHz and about 60 MHz.

In some embodiments, the plasma control scheme 188 further includes an edge tuning circuit 170, which may be used to adjust one or more characteristics of the plasma 101 formed between the substrate support assembly 136 and the chamber lid 123. In some embodiments, the edge tuning circuit 170 may be used to adjust a density of the portion of the plasma 101 formed over a circumferential edge of a substrate 103 disposed on the substrate support assembly 136 relative to a density of the portion of the plasma 101 formed over the surface of the center of the substrate 103. Generally, as used herein, the plasma density refers to the number of free electrons in the bulk plasma per unit volume, (e.g., number of free electrons/cm$^3$), which in some embodiments may be in the range of about $10^8$ cm$^{-3}$ to about $10^{11}$ cm$^{-3}$. The edge tuning circuit 170 enables the manipulation of one or more characteristics of the RF power used to maintain the plasma 101 in the region over the edge of the substrate support assembly 136 relative to the RF power used to maintain the plasma 101 in the region over the center portion of the substrate support assembly 136. For example, the edge tuning circuit 170 may be used to adjust one or more of the voltage, current, and/or phase of the RF power at the edge of the substrate support assembly 136 relative to the RF power in the center region 103A of the substrate support assembly 136.

As discussed further below, the edge tuning circuit 170 may be electrically coupled to an edge control electrode 115 disposed in the substrate support assembly 136. In some embodiments, an RF signal used to ignite and/or maintain the plasma 101 is delivered from the plasma generator assembly 163 to the support base 107, which is capacitively coupled to the edge control electrode 115 through a layer of dielectric material disposed therebetween. The edge tuning circuit 170 may be used to adjust one or more characteristics of the RF power used to maintain the plasma in the region over the edge control electrode 115, e.g., by adjusting the voltage, current, and/or the phase of the RF power at the edge control electrode 115 relative to the RF power provided to the support base 107.

In some embodiments, the differences between the voltages, currents, and/or phases of the RF power used to ignite and/or maintain the plasma in the regions over the edge control electrode 115 and the bias electrode 104 are determined and/or monitored by measuring or determining the respective voltages, currents, and/or phases of the RF power at the edge control electrode 115 and/or the bias electrode 104. In some embodiments, one or more characteristics of the RF power at the edge control electrode 115 and/or the bias electrode 104 are measured and/or determined using the signal detection module 187 described below.

As discussed above, in some embodiments, the plasma generator assembly 163, which includes an RF generator 118 and an RF match assembly 160, is generally configured to deliver a desired amount of a continuous wave (CW) or pulsed RF power at a desired substantially fixed sinusoidal waveform frequency to a support base 107 of the substrate support assembly 136 based on control signals provided from the system controller 126. During processing, the plasma generator assembly 163 is configured to deliver RF power (e.g., an RF signal) to the support base 107 disposed proximate to the substrate support 105 and within the substrate support assembly 136. The RF power delivered to the support base 107 is configured to ignite and maintain a processing plasma 101 of processing gases disposed within the processing volume 129.

In some embodiments, the support base 107 is an RF electrode that is electrically coupled to the RF generator 118 via an RF matching circuit 162 and a first filter assembly 161, which are both disposed within the RF match assembly 160. The first filter assembly 161 includes one or more electrical elements that are configured to substantially prevent a current generated by the output of a PV waveform generator 150 from flowing through an RF power delivery line 167 and damaging the RF generator 118. The first filter assembly 161, acts as a high impedance (e.g., high Z) to the PV signal generated from a PV pulse generator P1 within the PV waveform generator 150 and thus inhibits the flow of current to the RF matching circuit 162 and RF generator 118.

In some embodiments, the RF match assembly 160 and RF generator 118 are used to ignite and maintain a processing plasma 101 using the processing gases disposed in the processing volume 129 and fields generated by the RF power (RF signal) delivered to the support base 107 by the RF generator 118. The processing volume 129 is fluidly coupled to one or more dedicated vacuum pumps through a vacuum outlet 120, which maintain the processing volume 129 at sub-atmospheric pressure conditions and evacuate processing and/or other gases, therefrom. In some embodiments, the substrate support assembly 136, disposed in the processing volume 129, is disposed on a support shaft 138 that is grounded and extends through the chamber base 124. However, in some embodiments, the RF match assembly 160 is configured to deliver an RF power to the bias electrode 104 disposed in the substrate support 105 versus the support base 107.

In some embodiments, the edge tuning circuit 170 is used to control and/or adjust one or more characteristics of an RF waveform established at the edge control electrode 115 (e.g., the second RF waveform 602 illustrated in FIG. 6) relative to one or more characteristics of an RF waveform established at the bias electrode 104, (e.g., the first RF waveform 601 illustrated in FIG. 6). In some embodiments, such as shown in FIGS. 1A and 2, the edge tuning circuit 170 is electrically coupled between the edge control electrode 115 and ground. In other embodiments, such as shown in FIG. 1B and as shown in phantom in FIG. 2, the edge tuning circuit 170 may be electrically coupled between the edge control electrode 115 and the plasma generator assembly 163 and is thus electrically coupled between the edge control electrode 115 and the support base 107.

The substrate support assembly 136, as briefly discussed above, generally includes the substrate support 105 (e.g., ESC substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing. In some embodiments, the support base 107 includes one or more cooling channels (not shown) disposed therein that are fluidly coupled to, and in fluid communication with, a coolant source (not shown), such as a refrigerant source or water source having a relatively high electrical resistance. In some embodiments, the substrate support 105 includes a heater (not shown), such as a resistive heating element embedded in the dielectric material thereof. Herein, the support base 107 is formed of a corrosion-resistant thermally conductive material, such as a corrosion-resistant metal, for example, aluminum, an aluminum alloy, or a stainless steel, and is coupled to the substrate support with an adhesive or by mechanical means.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof. In some embodiments, one or more characteristics of the RF power used to maintain the plasma 101 in the processing region over the bias electrode 104 are determined and/or monitored by measuring an RF waveform established at the bias electrode 104 (e.g., the first RF waveform 601 in FIG. 6). Typically, the first RF waveform 601 is established by delivering an RF signal from the plasma generator assembly 163 to the substrate support 105, which is capacitively coupled to the bias electrode 104 through a dielectric material layer 105C (FIG. 1C) disposed therebetween.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a clamping network 116, which provides a chucking voltage thereto, such as static DC voltage between about −5000 V and about 5000 V, using an electrical conductor, such as the coaxial power delivery line 106 (e.g., a coaxial cable). As will be discussed further below, the clamping network 116 includes bias compensation circuit elements 116A, a DC power supply 155, and a bias compensation module blocking capacitor, which is also referred to herein as the blocking capacitor $C_5$. The blocking capacitor $C_5$ is disposed between the output of a pulsed voltage (PV) waveform generator 150 and the bias electrode 104.

Referring to FIGS. 1A and 1B, the substrate support assembly 136 may further include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1A, the edge control electrode 115 is positioned within a region of the substrate support 105. In some embodiments, as illustrated in FIG. 1A, the edge control electrode 115 includes a conductive mesh, foil, and/or plate that is disposed a similar distance (i.e., Z-direction) from the edge ring 114 as the bias electrode 104 from the substrate supporting surface 105A of the substrate support 105. In some other embodiments, such as shown in FIG. 1B, the edge control electrode 115 includes a conductive mesh, foil, and/or plate that is positioned on or within a region of a dielectric pipe 110, which surrounds at least a portion of the bias electrode 104 and/or the substrate support 105. The dielectric pipe 110 can be made of various insulators, such as aluminum oxide, aluminum nitride, or quartz. In some embodiments, the dielectric pipe 110 can include several parts made of same or different materials. Alternately, in some other embodiments (not shown), the edge control electrode 115 is positioned within or is coupled to the edge ring 114, which is disposed on and adjacent to the substrate support 105.

The edge control electrode 115 is generally positioned so that when used with the edge tuning circuit 170 and/or biased using the pulsed biasing scheme 140 (FIG. 1), due to its position relative to the substrate 103, it can affect or alter a portion of the generated plasma 101 that is over or outside of the circumferential edge of the substrate 103. In some embodiments, the edge tuning circuit 170, electrically coupled to the edge control electrode 115, may be used to manipulate one or more characteristics of the RF power used to ignite and/or maintain the plasma in the processing region 129A over the edge control electrode 115. For example, in some embodiments, the edge tuning circuit 170 may be used to adjust and/or manipulate one or more of the voltage, current, phase, and/or delivered power of the RF power used to ignite and/or maintain the plasma 101 in the processing region disposed between the edge control electrode 115 and the chamber lid 123.

In some embodiments, one or more characteristics of the RF power used to maintain the plasma 101 in the processing region over the edge control electrode 115 are determined and/or monitored by measuring one or more differences between the second RF waveform 602 and the first RF waveform 601 respectively established at the edge control electrode 115 and the bias electrode 104. In some embodiments, the differences in the one or more characteristics of the second RF waveform 602 and the first RF waveform 601 may be manipulated by use of the edge tuning circuit 170 to adjust the plasma density in the region over the circumferential edge of the substrate 103. Thus, the edge tuning circuit 170 may be beneficially used to control of the generation of activated species in the bulk plasma, which enables fine control over the ion and/or radical flux at the edge of the substrate 103 (edge region 103B) relative to the center region 103A of the substrate 103.

The edge control electrode 115 can be biased by use of a PV waveform generator 150 that is different from the PV waveform generator 150 that is used to bias the bias electrode 104. In some embodiments, the edge control electrode 115 can be biased by use of a PV waveform generator 150 that is also used to bias the bias electrode 104 by splitting part of the power to the edge control electrode 115. In one configuration, a first PV waveform generator 150 of the first PV source assembly 196 is configured to bias the bias electrode 104, and a second PV waveform generator 150 of a second PV source assembly 197 is configured to bias the edge control electrode 115.

In some embodiments, one or more characteristics of the generated RF power are measured and/or determined by use of a signal detection module 187 that is communicatively coupled to the system controller 126. The signal detection module 187 is generally configured to receive electrical signals from electrical signal traces (not shown) that are electrically coupled to various components within the processing systems 10A and 10B, e.g., at nodes N. The signal detection module 187 may include a plurality of input channels 172 each configured to receive an electrical signal from a corresponding electrical signal trace and a data acquisition module 169. The received electrical signals can include, without limitation, one or more characteristics of the RF signal delivered to the support base 107, the RF waveforms established at one or both of the bias electrode 104 and the edge control electrode 115, the pulsed voltage (PV) waveforms established at one or both of the bias electrode 104 and the edge control electrode 115, and the chucking voltages delivered to one or both of the bias electrode 104 and the edge control electrode 115. In some embodiments, the data acquisition module 169 is configured to generate a control signal that is used to automatically control one or more characteristics of the RF signal, RF waveforms, PV waveforms, and/or chucking voltages during substrate processing. In some embodiments, desired changes in the one or more characteristics are communicated to the signal detection module 187 by the system controller and the data acquisition module 169 may be used to implement the desired change.

In some embodiments and as shown, the second PV source assembly 197 includes a clamping network 116 that is electrically coupled to the edge control electrode 115 using an electrical conductor, such as the coaxial power delivery line 106 (e.g., a coaxial cable). The clamping network 116 can be used to deliver a static DC voltage, such as between about −5000 V and about 5000 V, to the edge control electrode and may include one or more bias compensation circuit elements 116A, a DC power supply 155, and a blocking capacitor $C_5$. The blocking capacitor $C_5$ is disposed between the output of a pulsed voltage (PV) waveform generator 150 and the edge control electrode 115. Here, the clamping network 116 of the second PV source assembly 197 is independently controllable from the clamping network 116 of the first PV source assembly 196. The clamping network 116 of the second PV source assembly 197 can be used to deliver a clamping voltage to the edge control electrode that is the same or is different from the clamping voltage delivered to the bias electrode to provide for an additional process tuning knob.

In some embodiments, the processing chamber 100 further includes the dielectric pipe 110, or collar, that at least partially circumscribes portions of the substrate support assembly 136. The dielectric pipe 110 provides dielectric barrier between the RF hot substrate support assembly 136 and a grounded liner 108, and also protects the substrate support 105 and/or the support base 107 from contact with corrosive processing gases or plasma, cleaning gases or plasma, or byproducts thereof. Typically, the dielectric pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

Substrate Support Assembly Configurations

Figure 1C:
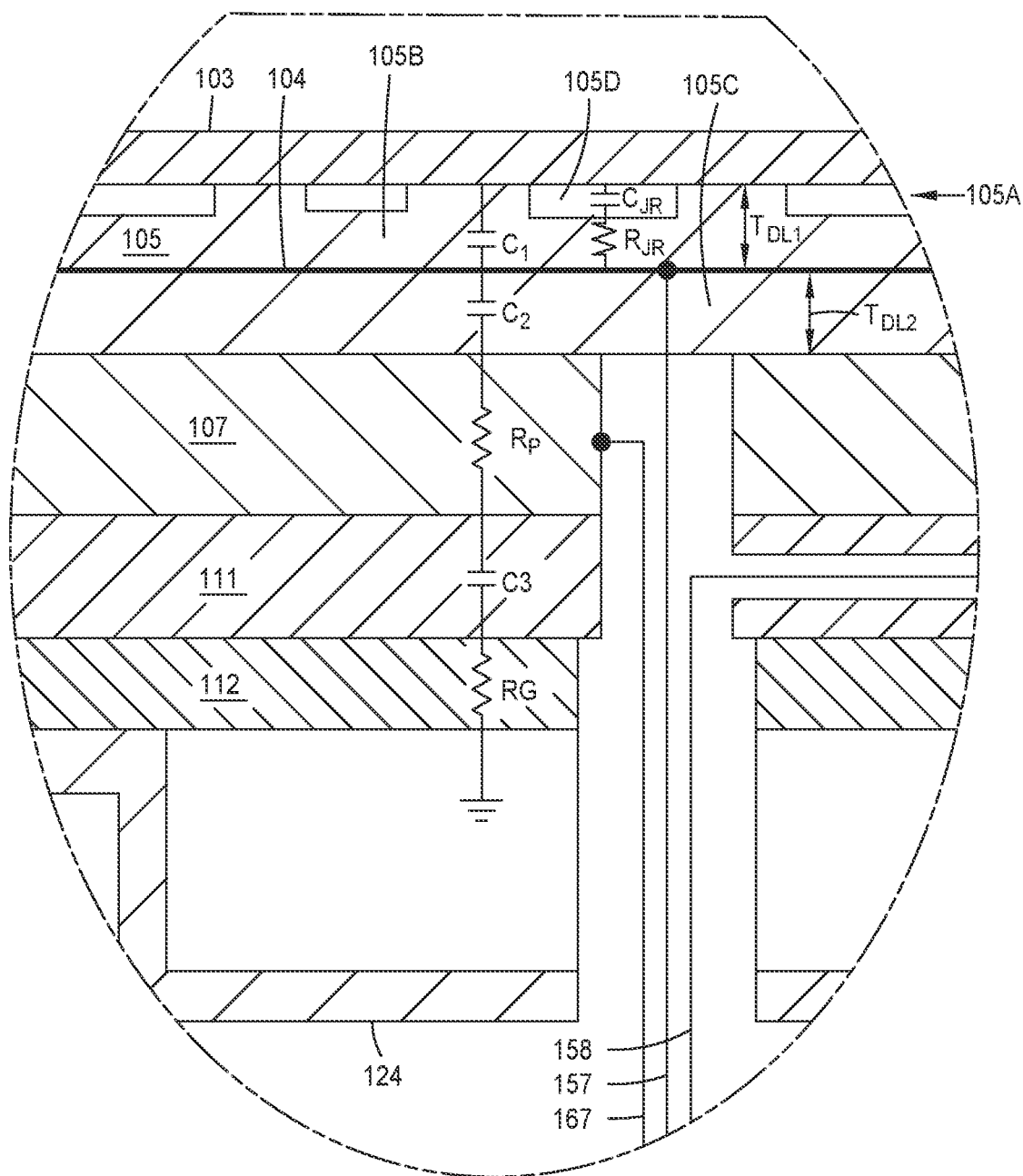
FIG. 1C is a close-up schematic cross-sectional view of a portion of the processing system illustrated in FIG. 1A, according to one embodiment.
Figure 3E:
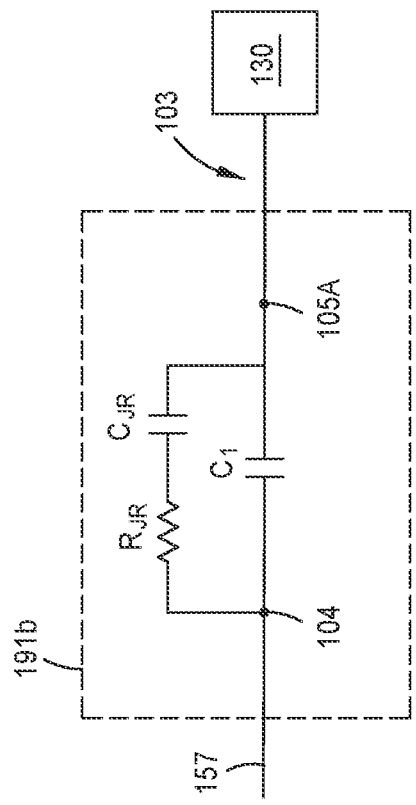
FIGS. 3D-3E are functionally equivalent circuit diagrams of different electrostatic chuck (ESC) types that can be used with one or both of the processing systems illustrated in FIGS. 1A-1B.
Figure 3D:
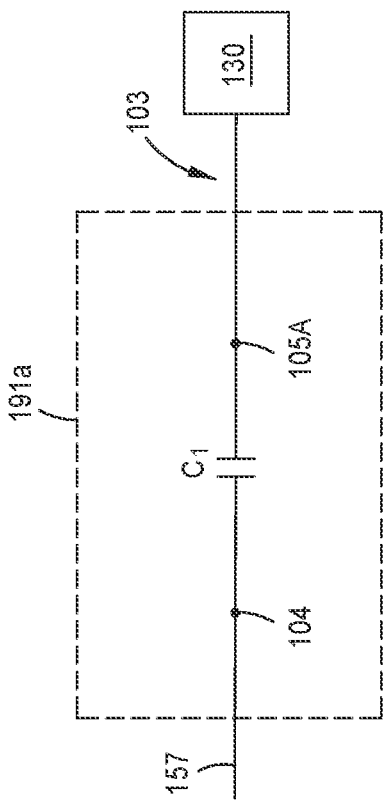

FIG. 1C is a close-up view of a portion of the substrate support assembly 136 shown in FIG. 1A and includes a simplified electrical schematic representation of the electrical characteristics of the various structural elements within one or more embodiments of the substrate support assembly 136. The simplified electrical schematic representation illustrated in FIG. 1C is equally applicable to the corresponding structural elements of the substrate support assembly 136 depicted in FIG. 1B. Here, the substrate support assembly 136 is configured as an electrostatic chuck (ESC) and may be either one of a Coulombic type ESC or a Johnsen-Rahbek type ESC. A simplified equivalent circuit model 191 for a Coulombic ESC and a Johnsen-Rahbek ESC are illustrated in FIGS. 3D and 3E, respectively, and discussed below. Generally, in either ESC configuration of substrate support assembly 136, the substrate 103 is secured to the substrate support 105 by providing a potential between the substrate 103 and a chucking electrode, which results in an electrostatic attraction force therebetween. In one embodiment, the bias electrode 104 is used as a chucking electrode in addition to facilitating to the pulsed voltage (PV) waveform biasing schemes described herein.

As shown, the substrate support assembly 136 includes the substrate support 105, the support base 107, the insulator plate 111, and the ground plate 112, which will each be discussed in turn. The substrate support 105 provides a substrate supporting surface 105A that is formed of a dielectric material and includes the bias electrode 104 embedded in the dielectric material. The bias electrode 104 functions as a chucking electrode and is spaced apart from a substrate support surface 105A, and thus the substrate 103, by the first dielectric material layer 105B, and from the support base 107, by a second dielectric material layer 105C.

In some embodiments, the ESC configuration may be used to secure the substrate 103 to the substrate support 105 in a relatively low-pressure (e.g., ultra-high vacuum) processing environment. In some embodiments, it may be desirable to heat and/or cool the substrate 103 during processing to maintain the substrate at a desired processing temperature. In those embodiments, the substrate support assembly 136 may be configured to maintain the substrate 103 at the desired temperature by heating or cooling the substrate support 105, and thus the substrate 103 disposed thereon. Often, in those embodiments, the substrate supporting surface 105A is patterned to have raised portions (e.g., mesas) that contact the substrate 103 and recessed portions that define a gap region 105D with the substrate 103. During substrate processing, an inert gas, e.g., helium, may be delivered to the gap region 105D, to improve heat transfer between the substrate supporting surface 105A and the substrate 103 disposed thereon.

The bias electrode 104 (chucking electrode) is electrically coupled to a DC power supply 155 (described above in FIGS. 1A-1B), which is configured to provide a potential between the substrate 103 and the bias electrode 104 and thus generate an electrostatic attraction (chucking force) therebetween. The substrate support assembly 136 may be configured as either one of a Coulombic ESC or Johnsen-Rahbek ESC, where the Johnsen-Rahbek type ESC may provide higher chucking forces and use a lower chucking voltage when compared to the Coulombic type ESC. In the Coulombic ESC, the dielectric material selected for the first dielectric material layer 105B will typically have a higher electrical resistance than a dielectric material selected for a Johnsen-Rahbek ESC resulting in the differences in the simplified functionally equivalent circuit models 191a, 191b illustrated in FIGS. 3C and 3E respectively.

In the simplest case, e.g., the circuit model 191a for the Coulombic ESC shown in FIG. 3D, the first dielectric layer 105B is formed of a dielectric material assumed to function as an insulator, e.g., having an infinite resistance $R_{JR}$, and the functionally equivalent circuit model 191a thus includes a direct capacitance $C_1$ between the bias electrode 104 and the substrate 103 through the first dielectric layer 105B. In some embodiments of the Coulombic ESC, the dielectric material and thickness $T_{DL1}$ of the first dielectric material layer 105B are be selected so that the capacitance $C_1$ is between about 5 nF and about 100 nF, such as between about 7 and about 20 nF. For example, the dielectric material layer 105B may be formed of a ceramic material (e.g., aluminum oxide ($Al_2O_3$), etc.) and have a thickness $T_{DL1}$ between about 0.1 mm and about 1 mm, such as between about 0.1 mm and about 0.5 mm, for example, about 0.3 mm.

In the more complex case, such as illustrated in the circuit model 191b of the Johnsen-Rahbek ESC shown in FIG. 3E, the circuit model 191b includes a capacitance $C_1$ that is coupled in parallel with a dielectric material resistance $R_{JR}$ and gap capacitance $C_{JR}$. Typically, in a Johnsen-Rahbek ESC, the dielectric material layer 105B is considered "leaky," in that it is not a perfect insulator and has some conductivity, since, for example, the dielectric material may be a doped aluminum nitride (AlN) having a permittivity (ε) of about 9. As with the circuit model 191a for the Coulombic ESC shown in FIG. 3D, there is a direct capacitance $C_1$ between the bias electrode 104 and the substrate 103 through the dielectric material layer 105B and the gap region 105D filled with helium. The volume resistivity of the dielectric layer within a Johnsen-Rahbek ESC is less than about $10^{12}$ ohms-cm (Ω-cm), or less than about $10^{10}$ Ω-cm, or even in a range between $10^8$ Ω-cm and $10^{12}$ Ω-cm, and thus the dielectric material layer 105B can have a dielectric material resistance $R_{JR}$ in a range between $10^6$-$10^{11}$ Ωs. In the model 191b of FIG. 3E, a gap capacitance $C_{JR}$ is used to account for the gas-containing gap regions 105D between the substrate 103 and substrate support surface 105A. It is expected that the gap capacitance $C_{JR}$ has a capacitance a bit larger than the capacitance $C_1$. Referring back to FIG. 1C, the electrical schematic representation of the circuit formed within the substrate support assembly 136 includes a support base dielectric layer capacitance $C_2$, which represents the capacitance of the second dielectric material layer 105C. In some embodiments, the thickness of the portion of the second dielectric material layer 105C is greater than the thickness of the first dielectric material layer 105B. In some embodiments, the dielectric materials used to form the dielectric layers on either side of the biasing electrode are the same material and form the structural body of the substrate support 105. In one example, the thickness of the second dielectric material layer 105C (e.g., $Al_2O_3$ or AlN), as measured in a direction extending between the support base 107 and the bias electrode 104, is greater than 1 mm, such as having a thickness between about 1.5 mm and about 100 mm. The support base dielectric layer capacitance $C_2$ will typically have a capacitance between about 0.5 and about 10 nanofarads (nF).

The electrical schematic representation of the circuit formed within the substrate support assembly 136, as shown in FIG. 1C, also includes a support base resistance $R_P$, an insulator plate capacitance $C_3$, and ground plate resistance $R_G$ that is coupled to ground on one end. Since the support base 107 and ground plate 112 are typically formed from a metal material, the support base resistance $R_P$ and ground plate resistance $R_G$ are quite low, such as less than a few milliohms. The insulator plate capacitance $C_3$ represents the capacitance of the dielectric layer positioned between the bottom surface of the support base 107 and the top surface of the ground plate 112. In one example, the insulator plate capacitance $C_3$ has a capacitance between about 0.1 and about 1 nF.

Biasing and Edge Control Schemes

FIG. 2 is a simplified schematic diagram of a biasing and edge control scheme that can be used with one or both of the processing systems 10A-10B illustrated in FIGS. 1A and 1B. As shown in FIG. 2, the RF generator 118 and PV waveform generators 150 are configured to deliver an RF waveform and pulsed-voltage waveforms, respectively, to one or more electrodes disposed within the processing volume 129 of the processing chamber 100. In one embodiment, the RF generator 118 and PV waveform generators 150 are configured to simultaneously deliver an RF waveform and pulsed-voltage waveform(s) to one or more electrodes disposed within the substrate support assembly 136.

As discussed above, the edge tuning circuit 170 is generally configured to control the uniformity of a plasma formed between the chamber lid 123 and the substrate support assembly 136, e.g., by controlling the plasma density (i.e., the free electron density in the bulk plasma) over the circumferential edge of the substrate 103. In some embodiments, as shown in FIG. 1A, and FIG. 2, the edge tuning circuit 170 is electrically coupled between the edge control electrode 115 (edge biasing electrode) and ground. In other embodiments, as shown in FIGS. 1B and 1n phantom in FIG. 2, the edge tuning circuit 170 is electrically coupled between the edge control electrode 115 and the plasma generator assembly 163, e.g., between the edge control electrode 115 and the RF match assembly 160.

In some embodiments, the edge tuning circuit 170 is configured as a resonant circuit that includes an inductor and a capacitor (e.g., an LC circuit) that may be used to adjust the voltage, current, and/or phase of the RF power used to maintain the plasma in the region over the edge control electrode. Example electrical circuits 170a, 170b, 170c, which may be used as the edge tuning circuit 170 in any one of the embodiments described herein, are illustrated in FIGS. 3A-3C. It should be noted that in FIGS. 3A and 3B, the edge tuning circuits 170a, 170b are shown as electrically coupled between the power delivery line 158 and ground, such as between the edge control electrode 115 and ground, as shown in FIG. 1A. However, it is contemplated that the example edge tuning circuits 170a, 170b illustrated in FIGS. 3A and 3B may also be electrically coupled between the power delivery line 158 and the plasma generator assembly 163 (shown in phantom), such as between the edge control electrode 115 and the RF match assembly 160, as shown in FIG. 1B. In some other embodiments, the edge tuning circuits 170 may be electrically coupled to the power delivery line 158, the plasma generator assembly 163, and ground at the same time, such as the edge tuning circuit 170c shown in FIG. 3C In one embodiment, shown in FIG. 3A, the edge tuning circuit 170a includes an inductor $L_2$ and a variable capacitor $C_7$ arranged in parallel (i.e., a parallel LC resonant circuit). In another embodiment, shown in FIG. 3B, the edge tuning circuit 170b includes an inductor $L_2$ and variable capacitor $C_7$ arranged in series (i.e., a serial LC resonant circuit). In another embodiment, shown in FIG. 3C, the edge tuning circuit 170c includes an inductor $L_2$ and the variable capacitor $C_8$ arranged in series (i.e., a serial LC resonant circuit) between the power delivery line 158 and the plasma generator assembly 163 (i.e., between the edge control electrode 115 and the RF match assembly 160) and a second variable capacitor $C_7$ arranged in series between the power delivery line 158 and ground.

In some embodiments, one or both of the variable capacitors $C_7$ or $C_8$ are adjustable from at least about 50 pF to about 500 pF, such as from at least about 50 pF to at least about 200 pF, or at least about 20 pF to about at least 250 pF.

The type of LC resonant circuit, e.g., parallel or serial or other structures, selected for the edge tuning circuit 170 may depend on the mechanical dimensions of the substrate support assembly 136, and the resulting electrical couplings between the conductive parts or electrodes, such as the edge ring, the edge electrode, the baseplate, the wafer electrode, the wafer, and the ground plate.

In some embodiments, the type of LC resonant circuit can be selected based on the desired ability to control the plasma density distribution that can be achieved by adjusting one or more parameters of the LC resonant circuit so that one or more characteristics of the second RF waveform 602 (FIG. 6) established at the edge control electrode 115, relative to the one or more characteristics of the first RF waveform 601 established at the bias electrode 104, can be adjusted. Simulated results of different control characteristics that can be achieved for exemplary edge tuning circuits 170 are described below in FIGS. 7A-7D.

Referring back to FIG. 2, in one non-limiting example, the RF generator 118 and a PV waveform generator 150 are configured to deliver an RF waveform and pulsed-voltage waveform to the support base 107 and bias electrode 104, respectively, which are both disposed in the substrate support assembly 136. In another example, the RF generator 118, a first PV waveform generator 150, and a second PV waveform generator 150 are configured to deliver an RF waveform, a first pulsed-voltage waveform and a second pulsed-voltage waveform to the support base 107, the bias electrode 104, and the edge control electrode 115, respectively, which are all disposed in the substrate support assembly 136.

Figure 4:
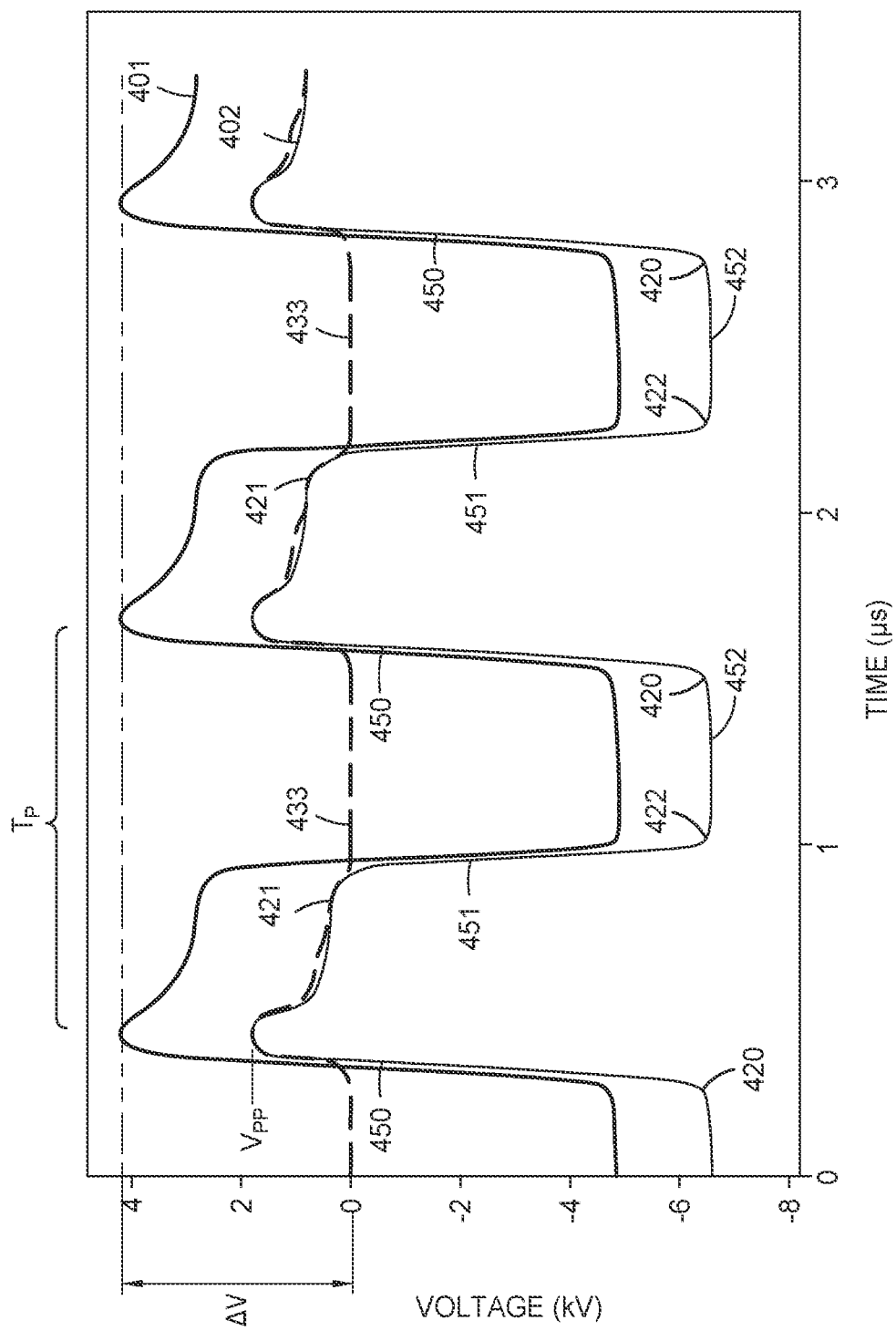
FIG. 4 illustrates examples of pulsed voltage (PV) waveforms that can be established using embodiments described herein.
Figure 5C:
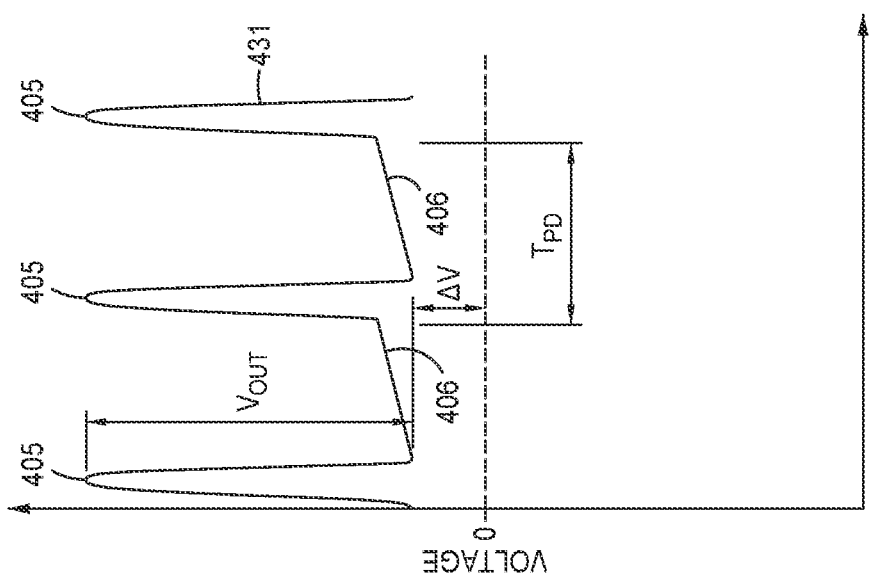
FIGS. 5A-5C illustrate examples of pulsed voltage (PV) waveforms that can be generated using embodiments described herein.
Figure 5B:
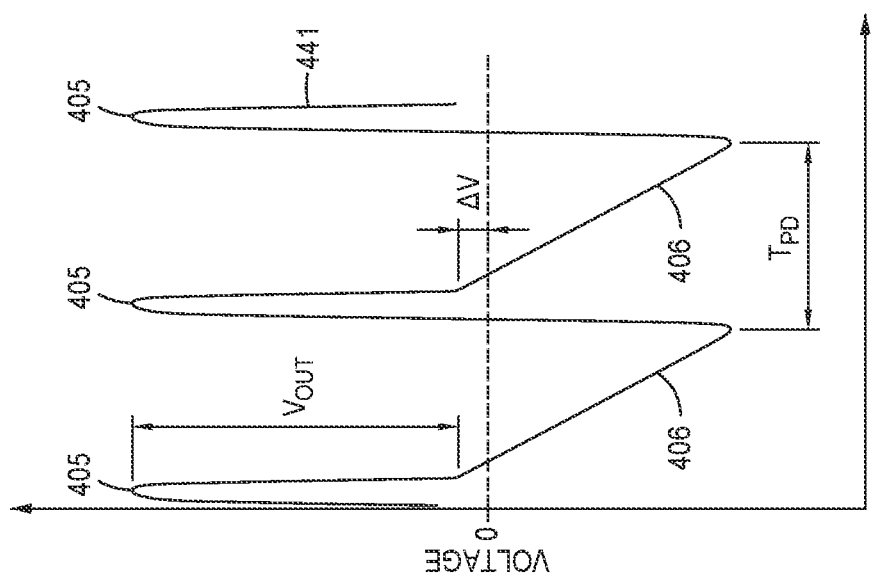
Figure 5A:
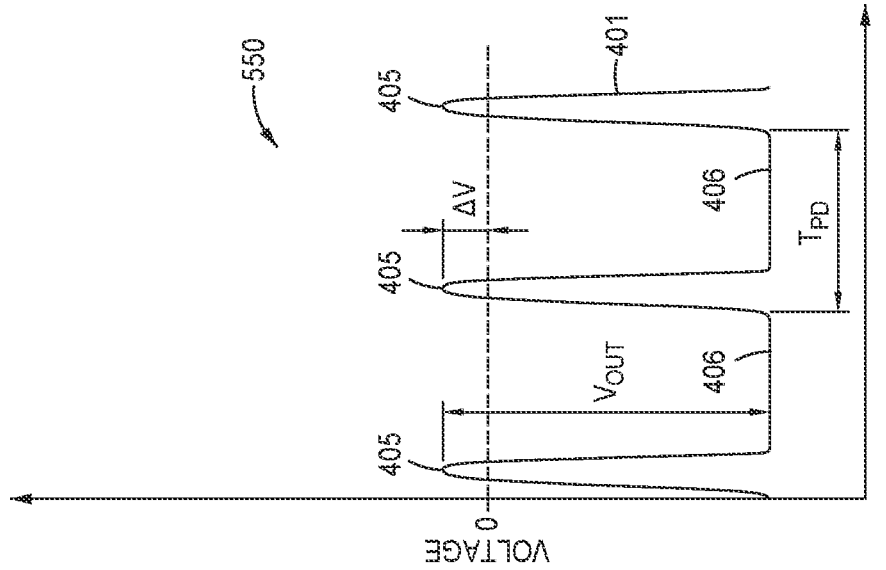

As illustrated in FIG. 2, the RF generator 118 is configured to provide a sinusoidal RF waveform (RF signal) to one or more electrodes disposed in the chamber body 113 by delivering the RF signal, which includes the sinusoidal RF waveforms, here the RF waveforms 601, 602 (FIGS. 6A-6B), through the RF (plasma) match assembly 160, which includes the RF matching circuit 162 and the first filter assembly 161. Additionally, each of the PV waveform generators 150 are configured to provide a PV waveform, which typically includes a series of voltage pulses (e.g., sub-microsecond voltage pulses, including nanosecond voltage pulses), to the one or more electrodes disposed in the chamber body 113 by establishing a PV waveform at the bias electrode 104 or the edge electrode 115 through the second filter assembly 151. The components within the clamping network 116 can be optionally positioned between each PV waveform generator 150 and the second filter assembly 151. Examples of PV waveforms 401a-c that can be provided by the each of the PV waveform generators 150 are shown in FIGS. 5A-5C. An example of a PV waveform 401 that can be established at the bias electrode 104 and/or edge control electrode 115 is shown in FIG. 4.

During processing, a PV waveform is provided to the bias electrode 104 by the PV waveform generator 150 of the first PV source assembly 196 and a PV waveform is provided to the edge control electrode 115 by the PV waveform generator 150 of the second PV source assembly 197. The pulsed voltage waveforms provided to the load (e.g., the complex load 130 shown in FIGS. 3D-3E) disposed within the processing chamber 100. The PV waveform generators 150 are coupled to the bias electrode 104 and the edge control electrode 115 through the respective power delivery lines 157 and 158. The overall control of the delivery of the PV waveform from each of the PV waveform generators 150 is controlled by use of signals provided from the system controller 126.

In one embodiment, the PV waveform generators 150 are configured to output a periodic voltage function at time intervals of a predetermined length, for example, by use of a signal from a transistor—transistor logic (TTL) source (not shown). The periodic voltage function generated by the transistor—transistor logic (TTL) source can be two-states DC pulses between a predetermined negative or positive voltage and zero. In one embodiment, a PV waveform generator 150 is configured to maintain a predetermined, substantially constant negative voltage across its output (i.e., to ground) during regularly recurring time intervals of a predetermined length, by repeatedly closing and opening one or more switches at a predetermined rate. In one example, during a first phase of a pulse interval a first switch is used to connect a high voltage supply to the bias electrode 104, and during a second phase of the pulse interval a second switch is used to connect the bias electrode 104 to ground. In another embodiment, the PV waveform generator 150 is configured to maintain a predetermined, substantially constant positive voltage across its output (i.e., to ground) during regularly recurring time intervals of a predetermined length, by repeatedly closing and opening its internal switch (not shown) at a predetermined rate.

In one configuration, during a first phase of a pulse interval a first switch is used to connect the bias electrode 104 to ground, and during a second phase of the pulse interval a second switch is used to connect a high voltage supply to the bias electrode 104. In an alternate configuration, during a first phase of a pulse interval a first switch is positioned in an open state, such that the bias electrode 104 is disconnected from the high voltage supply and the bias electrode 104 is coupled to ground through an impedance network (e.g., inductor and resistor connected in series). Then, during a second phase of the pulse interval, the first switch is positioned in a closed state to connect the high voltage supply to the bias electrode 104, while the bias electrode 104 remains coupled to ground through the impedance network.

The PV waveform generators 150 may include a PV generator and one or more electrical components, such as but not limited to high repetition rate switches (not shown), capacitors (not shown), inductors (not shown), fly back diodes (not shown), power transistors (not shown) and/or resistors (not shown), which are configured to provide a PV waveform to an output. An actual PV waveform generator 150, which can be configured as a nanosecond pulse generator, may include any number of internal components.

A power delivery line 157 electrically connects the output of the PV waveform generator 150 of the first PV source assembly 196 to an optional filter assembly 151 and the bias electrode 104. While the discussion below primarily discusses the power delivery line 157 of the first PV source assembly 196, which is used to couple a PV waveform generator 150 to the bias electrode 104, the power delivery line 158 of the second PV source assembly 197, which couples a PV waveform generator 150 to the edge control electrode 115, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e). The optional filter assembly 151 includes one or more electrical elements that are configured to substantially prevent a current generated by the output of the RF generator 118 from flowing through the power delivery line 157 and damaging the PV waveform generator 150. The optional filter assembly 151 acts as a high impedance (e.g., high Z) to the RF signal generated by the RF generator 118, and thus inhibits the flow of current to the PV waveform generator 150.

In some embodiments, as shown in FIGS. 1A-1B, the PV waveform generator 150 of the first PV source assembly 196 is configured to provide a pulsed voltage waveform signal to the bias electrode 104, and eventually the complex load 130 (FIGS. 3D-3E), by delivering the generated pulsed voltage waveforms through the blocking capacitor $C_5$, the filter assembly 151, the power delivery line 157, and capacitance $C_1$ (FIG. 1C). In some embodiments, the plasma control scheme 188 may further include a blocking resistor (not shown) positioned within the components connecting the clamping network 116 to a point within the power delivery line 157. The main function of the blocking capacitor $C_5$ is to protect the PV waveform generator 150 from the DC voltage produced by the DC power supply 155, which thus drops across blocking capacitor $C_5$ and does not perturb the output of the PV waveform generator 150. The purpose of the blocking resistor in the clamping network 116 is to block the pulsed voltage generated by the PV waveform generator 150 enough to minimize the current it induces in the DC power supply 155.

Waveform Examples

FIG. 4 illustrates an example of a PV waveform 401 that can be established at the bias electrode 104 and a PV waveform 402 established at the substrate 103 due to the delivery of the PV waveform 401 to the bias electrode 104. The PV waveform 401 is based on a PV waveform 401a (FIG. 5A) generated by the PV waveform generator 150 electrically coupled to the bias electrode 104. The PV waveforms 401, 402 can also represent PV waveforms established at the edge control electrode 115 and the edge ring 114, respectively.

Here, the PV waveform 401 is established at the bias electrode 104 and/or edge control electrode 115 by use of the PV waveform generator 150 within the respective PV source assembly 196, 197 and a DC voltage source 155 of the corresponding clamping network 116. Turning to FIG. 4, the output of the PV waveform generator 150, which can be controlled by a setting in a plasma processing recipe stored in the memory of the controller 126, establishes the PV waveform 401, which includes a peak-to-peak voltage $V_{PP}$ referred to herein as the pulse voltage level $V_{PP}$. Here, the PV waveform 402, which is the waveform seen by the substrate 103 due to establishing the PV waveform 401 at the bias electrode 104, is characterized as including a sheath collapse and recharging phase 450 (or for simplicity of discussion, the sheath collapse phase 450) that extends between point 420 and point 421, a sheath formation phase 451 that extends between point 421 and point 422, and an ion current phase 452 that extends between point 422 and back to the start at point 420 of the next sequentially established pulse voltage waveform period. The sheath collapse phase 450 generally includes a time period where the capacitance of the sheath is discharged and the substrate potential is brought to the level of the local plasma potential 433.

Depending on the desired plasma processing conditions, it may be desirable to control and set at least the PV waveform characteristics, such as PV waveform frequency (1/$T_P$), pulse voltage level $V_{PP}$, pulse voltage on-time, and/or other parameters of the PV waveform 401 to achieve desirable plasma processing results on a substrate 103. In one example, pulse voltage (PV) on-time, which is defined as the ratio of the ion current time period (e.g., time between point 422 and the subsequent point 420 in FIG. 4) and the waveform period $T_P$, is greater than 50%, or greater than 70%, such as between 80% and 95%.

In some embodiments, the PV waveform generator 150 is configured to provide a PV waveform 401a having a generally constant negative voltage during the second portion 406, as shown in FIGS. 4 and 5A. In some embodiments, due to the ion current ($I_i$) depositing a positive charge on the substrate surface during the ion current phase 452, the voltage at the substrate surface will increase over time, as seen by the positive slope of the line between points 422 and 420 (FIG. 4). The voltage increase over time at the substrate surface will reduce the sheath voltage and result in a spread of the ion energy distribution. Therefore, it is desirable to control and set at least the PV waveform frequency (1/$T_P$), where $T_P$ is the PV waveform period (FIG. 5A)) to minimize the effects of the reduction in the sheath voltage and spread of the ion energy distribution.

FIGS. 5A-5C illustrate respective PV waveforms 401a-c that can be used to establish a PV waveform at the biasing electrode 104 or edge control electrode 115 electrically coupled to the PV waveform generators. The PV waveforms 401a-c are representative of pulse voltage waveforms established at a node connected to the input of the clamping network 116, and thus may differ from the corresponding pulse voltage waveforms that are established at substrate 103 or edge ring 114. A DC offset ΔV found in each PV waveform 401a-c is dependent on the bias applied by the DC power supply 155 in the clamping network 116 and various properties of the PV waveform generator 150 configuration used to establish the PV waveform. Generally, the waveform periods of each of the PV waveforms 401a-c are characterized as having a first region 405 that corresponds to the sheath collapse phase 450 and a second region 406 that corresponds to the sheath formation phase 451 and the ion current phase 452.

FIG. 5A illustrates a PV waveform 401a having a constant negative voltage for at least a portion of the second region 406, e.g., during a corresponding ion current phase 452 of the waveform 401 established at the bias electrode 104. FIG. 5B illustrates a shaped pulse voltage waveform 401b that can be generated by the PV waveform generator 150 and used to establish a shaped PV waveform (not shown) at the bias electrode 104 and/or edge control electrode 115. In some embodiments, the shaped pulse waveform 401b is formed by a PV waveform generator 150 configured to supply a positive voltage during one or more phases of a voltage pulse (e.g., first region 405) and a negative voltage during one or more phases of the voltage pulse (e.g., second region 406) by use of one or more internal switches and DC power supplies. Here, the first region 405, generally corresponds to the sheath collapse phase 450, the second region 406, generally corresponds to the sheath formation phase 451 and the ion current phase 452, and the voltage in the second region 406 may include a negative slope. The negative slope in the second region 406 may be used to compensate for the ion current flowing to the substrate 103 or edge ring 114 during the ion current phase or as a control knob to adjust the spread of the ion energy distribution at the surface of the substrate.

In some embodiments, the PV waveform generator 150 is configured to provide the pulse voltage waveform 401c illustrated in FIG. 5C to establish a PV waveform (not shown) at the bias electrode 104 and/or edge control electrode 115. In this example, the first region 405 generally corresponds to the sheath collapse phase 450, the second region 406 generally corresponds to the sheath formation phase 451 and the ion current phase 452, and the voltage in the second region 406 may include a positive slope that provides a control knob to adjust the spread of the ion energy distribution at the surface of the substrate.

Figure 6A:
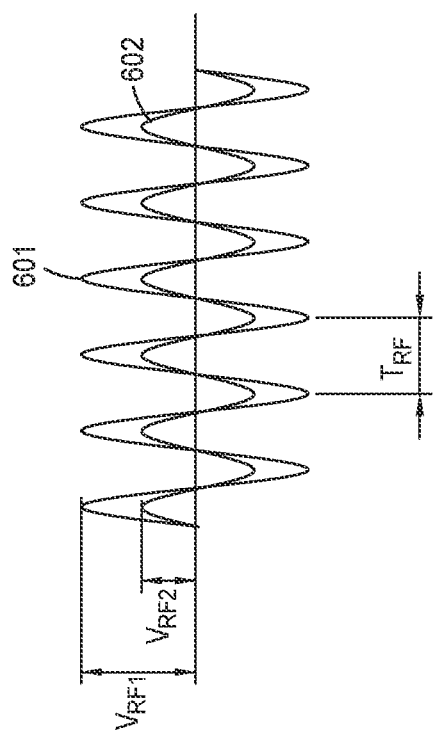
FIGS. 6A-6B illustrate example radio frequency (RF) waveforms that can be established using embodiments described herein.
Figure 6B:
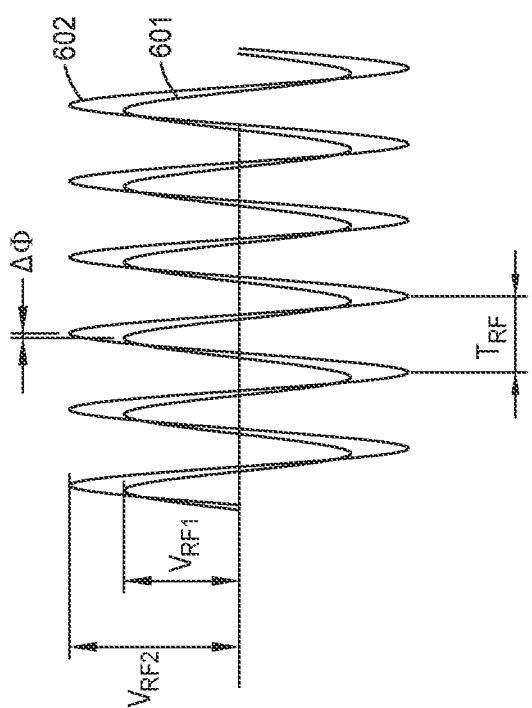

FIGS. 6A-6B illustrate a first RF waveform 601 established at the bias electrode 104 and a second RF waveform 602 established at the edge control electrode 115, due to the capacitive coupling of the RF signal provided to the support base 107 by the RF generator 118 within the plasma generator assembly 163. The waveform characteristics of the first RF waveform 601 and the second RF waveform 602 are controlled by use of the edge tuning circuit 170 configuration, such as one of the configurations illustrated in FIG. 3A (parallel LC resonant circuit), FIG. 3B (serial resonant circuit) or FIG. 3C. The example waveforms illustrated in FIGS. 6A-6B and the simulated results shown below in FIGS. 7A-7D are not intended to be limiting as to the scope of the disclosure provided herein but are provided to simplify the discussion.

Generally, the RF signal provided to the support base 107 has a relatively high frequency, so that the first RF waveform 601 and the second RF waveform 602 have a correspondingly high frequency ($1/T_{RF}$) of about 1 MHz or greater, for example, between about 30 MHz and about 60 MHz. The edge tuning circuit 170 as described in the various embodiments disclosed herein may be used to adjust one or more characteristics of the second RF waveform 602 established at the edge control electrode 115 relative to one or more characteristics of the first RF waveform 601 established at the bias electrode 104. In some embodiments, the one or more relative characteristics include a ratio of RF waveform amplitude between the second RF waveform 602 and the first RF waveform 601 (e.g., voltage amplitude ratio $V_{RF2}/V_{RF1}$), a ratio of RF current amplitude between the second RF waveform 602 and the first RF waveform 601 (e.g., current amplitude ratio not shown), a phase difference (Δϕ) between the second RF waveform 602 and the first RF waveform 601, and/or a ratio of RF delivered power between the second RF waveform 602 and the first RF waveform 601 (e.g., delivered power ratio not shown).

The one or more characteristics of the second RF waveform 602 relative to the first RF waveform 601 can be determined and/or monitored by measuring the respective voltages, currents, phases, and/or respective powers of the RF waveforms established at the edge control electrode 115 and the bias electrode 104. The measured characteristics of the second RF waveform 602 and the first RF waveform 601 correspond to properties of the bulk plasma in the portions formed above the edge control electrode 115 and the bias electrode 104, respectively, such as the plasma density. The determined differences between the second RF waveform 602 and the first RF waveform 601 can be used to monitor and control the differences in electron density in the portion of the bulk plasma formed over the edge ring 114 and the electron density of the portion of the bulk plasma formed over the center portion of the substrate 103. The uniformity and/or distribution of plasma density may be controlled and/or adjusted to achieve desired processing results by use of the edge tuning circuit 170, such as by using the system controller 126 to adjust the variable capacitor $C_7$.

Figure 7A:
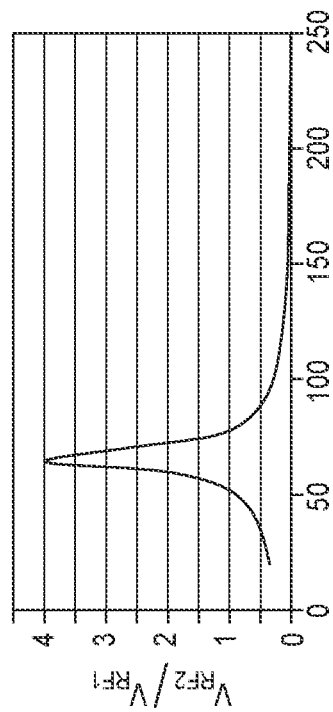
FIGS. 7A-7D are graphs of simulated results, for example, using edge tuning circuit configurations according to embodiments herein.
Figure 7B:
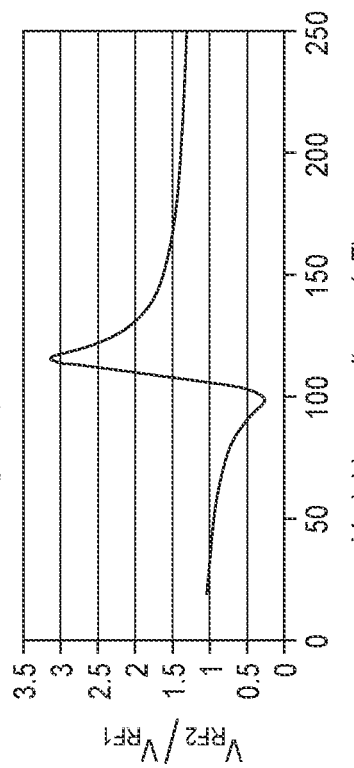
Figure 7C:
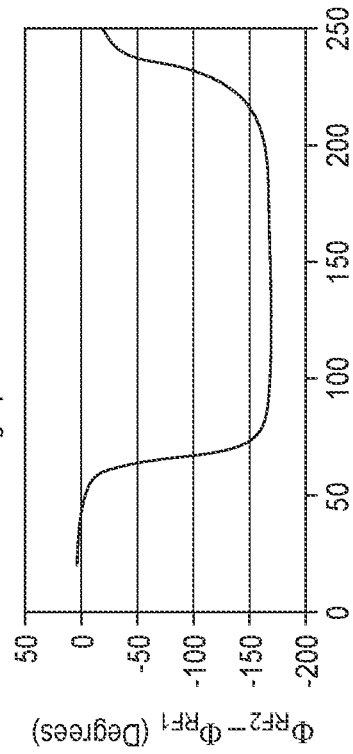
Figure 7D:
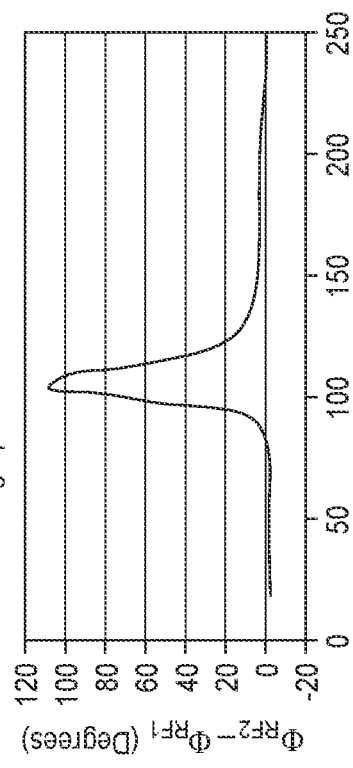

Non-limiting simulated results for the edge tuning circuit 170 illustrated in FIGS. 3A and 3B are shown in FIGS. 7A-7B, and simulated results for the edge tuning circuit 170 with combined series and the parallel configuration illustrated in FIG. 3C are shown in FIGS. 7C-7D. In FIGS. 7A and 7C, the simulated results provide an example of LC circuit tuning curves that illustrate the effect of varying the capacitance (e.g., by adjusting variable capacitor $C_7$, $C_8$ of the respective edge tuning circuit 170 configurations) across the range of about 20 pF to about 250 pF on the ratio of voltage amplitude between second RF waveform 602 and first RF waveform 601 (e.g., $V_{RF2}/V_{RF1}$). In FIGS. 7B and 7D, the simulated results provide an example of LC circuit tuning curves that illustrate the effect that varying the capacitance of $C_7$, $C_8$ has on the phase difference between the second RF waveform 602 and the first RF waveform 601 (e.g., $\phi_{RF2} - \phi_{RF1}$).

As shown in FIG. 7A, a variable capacitance $C_7$ of the edge tuning circuit 170 (configuration in FIG. 3A) having a value of about 170 pF has a corresponding voltage amplitude ratio ($V_{RF2}/V_{RF1}$) of about 1.5. As shown in FIG. 7B, the phase difference corresponding to the 170 pF capacitance for an edge tuning circuit 170 having the same configuration as in FIG. 7A is relatively small, e.g., less than 5 degrees, thus resulting in amplification of the second RF waveform 602 relative to the first RF waveform 601 and a small phase difference (Δϕ) therebetween, as shown in FIG. 6A.

In FIGS. 7C-7D the variable capacitance $C_7$ of the edge tuning circuit 170 (configuration in FIG. 3C) may be set to a value of about 25 pF, and the resulting voltage amplitude ratio ($V_{RF2}/V_{RF1}$) is equal to about 0.5 (FIG. 7C), and the phase difference ($\Delta\phi$) is about null, as shown in FIG. 6B.

As shown in FIG. 7A, the simulated results based on the edge tuning circuit 170 configuration of FIG. 3A (e.g., parallel LC resonant circuit) show resonance peaks at about 100 pF and about 120 pF. In FIG. 7D, the simulated results for the edge tuning circuit 170 (not shown) show resonance phase transitions at 60 pF and 250 pF. In some embodiments, it may be desirable to operate the respective edge tuning circuit 170 at either side of the resonance during the period an RF plasma is maintained. In some embodiments, the edge tuning circuit 170 may be configured, e.g., by use of variable capacitors in combination of parallel and series LC circuits, to allow switching operation of the edge tuning circuit 170 between either side of a resonance peak without crossing through the resonant region. As noted above, the simulated results shown in FIGS. 7A-7D are not intended to be limiting as other edge tuning circuit 170 configurations may be used to provide other desired operating ranges for amplifying, reducing, and/or equalizing the voltage amplitude ratio ($V_{RF2}/V_{RF1}$) and/or a current amplitude ratio and/or phase difference between the second RF waveform 602 and the first RF waveform 601.

In some embodiments, it may be desirable to select a tuning circuit configuration and/or variable capacitance $C_7$, $C_8$ that causes a phase difference between the respective RF waveforms, which amplifies the electric field between the edge control electrode 115 and the bias electrode 104. The amplified electric field results in a corresponding increase in plasma density in the portion of the plasma 101 formed over the substrate support assembly 136 at some distance between the two electrodes. In some embodiments, it may be desirable to select a tuning circuit configuration and/or variable capacitance C7 that does not cause a phase difference between the RF waveforms established at the respective electrodes so that the plasma density remains substantially uniform across the region spanning the edge of the substrate 103.

Beneficially, the edge tuning circuit 170 may be configured to provide a broad range of desired plasma processing conditions to control and/or adjust the plasma density distribution at different points between the center and edge of the substrate 103. The characteristics of the edge tuning circuit 170, and thus position of the system on the tuning curves (FIGS. 7A-7D) may be controlled by use of the system controller 126, by adjusting one or more variable capacitors $C_7$, $C_8$. The controlled adjustment of the characteristics of edge tuning circuit by the system controller 126 will allow for relatively easy changes in plasma processing conditions, within a single substrate plasma process, between consecutive substrate plasma processes, and/or for different types of substrates, without the need for manually changing hardware related configurations. Thus, the embodiments described herein may be used to provide an improved edge to center processing uniformity control methods, such as described below in relation to FIGS. 8A-8C and 9A-9D.

In some embodiments, the tuning circuit is automatically adjusted to maintain desired processing conditions, such as to account for plasma uniformity drift due to changes in the geometries and/or materials of the various components of the processing chamber 100 over time. For example, the methods may be used to automatically adjust the tuning circuit, such as by changing the capacitance $C_7$, $C_8$, to account for changes in the thickness of the edge ring 114 that may be caused by erosion of the dielectric material used to form the edge ring 114 due to ion bombardment. For example, in some embodiments, the system controller 126, by use of the signal detection module 187, may be configured to: detect signals of one or more electrical parameters at corresponding nodes N of the processing system 10A, 10B; determine whether the processing system 10A, 10B is operating within desired processing conditions by comparing the characteristics of the detected signals with one or more control limits; and, when the electrical signal characteristics are outside of the control limits, adjust one or more components of the edge tuning circuit 170. Some embodiments include automatically adjusting the edge tuning circuit, such as adjusting the capacitance $C_7$ to maintain a desired RF voltage amplitude ratio, RF current amplitude ratio, and/or RF phase difference between the different RF waveforms at the edge control electrode 115 and the bias electrode 104.

In some embodiments, the system controller 126 is configured to automatically adjust the edge tuning circuit 170 based on desired processing conditions and/or desired characteristics between the RF waveform at the edge control electrode 115 and the bias electrode 104 by comparing the processing condition(s) and/or RF waveforms to predetermined limits, e.g., control limits, and changing one or more set points, such as capacitance $C_7$, $C_8$, of the edge tuning circuit 170 based on an algorithm or lookup table stored in memory 134 of the system controller 126.

In some embodiments, the edge tuning circuit 170 may be manually adjusted and/or controlled by adjusting one or more components of the edge tuning circuit 170 to a desired set point, and/or within desired control limits, where the desired set point and/or control lists are selected by a user and stored in the instructions used to control the processing system 10A, 10B. For example, a capacitance $C_7$ of the edge tuning circuit 170 may be controlled to a desired capacitance determined by a user and stored in memory of the system controller 126.

Processing Applications

In general, the pulsed voltage waveforms established the electrodes 104 and 115, such as either the negative pulse waveforms 401, shaped pulse waveforms 441 or positive pulse waveforms 431, include a periodic series of pulse voltage (PV) waveforms repeating with a period $T_{PD}$, on top of a voltage offset ($\Delta V$). In one example, the period $T_{PD}$ of the PV waveforms can be between about 1 µs and about 5 µs, such as about 2.5 µs, e.g., between about 200 kHz and about 1 MHz, or about 400 kHz, such as about 1 MHz or less, or about 500 kHz or less.

As discussed above, in some embodiments, the processing chamber 100 will at least include one or more RF generators 118, and their associated first filter assembly 161, and one or more PV generators 314, and their associated second filter 151, that are together configured to deliver desired waveforms to one or more electrodes disposed within the substrate support assembly 136. The software instruction stored in memory of the system controller 126 are configured to cause the generation of an RF waveform that is configured to establish, maintain and control one or more aspects of a plasma formed within the processing chamber. The one or more aspects of the plasma that are controlled can include but are not limited to, plasma density, plasma chemistry, and ion energy in the plasma formed in the processing volume 129.

Figure 8A:
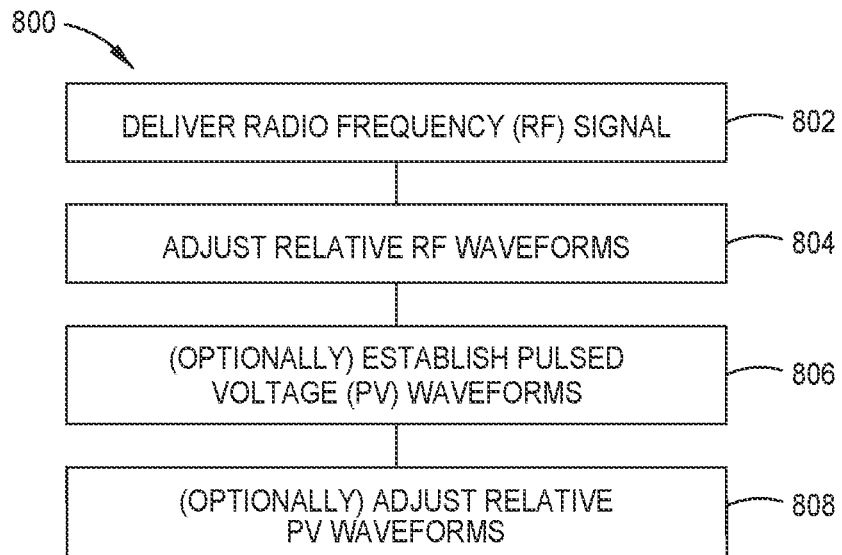
FIGS. 8A-8C are diagrams illustrating processing methods that can be performed using embodiments described herein.

FIG. 8A is a process flow diagram illustrating a method 800 of controlling plasma uniformity during substrate processing, according to one embodiment. FIGS. 9A-9D are close up sectional views schematically illustrating of a portion of a processing system 10, which may be used to perform aspects of the methods 800, 810, and 820. The portion of the processing system 10 shown in FIGS. 9A-9D is the edge portion of a substrate support assembly 136 and the corresponding portions of the processing region 129A and chamber lid 123 disposed there above. The processing system 10 illustrated in FIGS. 9A-9B may include any one or combination of the features of the processing systems 10A and 10B described in FIGS. 1A and 1B, respectively.

At activity 802, the method 800 includes delivering a first radio frequency (RF) signal to a support base 107 of a substrate support assembly 136 disposed in a processing volume 129 of a processing chamber 100. Generally, the RF signal is delivered to the support base 107 using a plasma generator assembly 163 that is electrically coupled thereto. Here, the RF signal is configured to ignite and/or maintain a processing plasma 101 in a processing region 129A of the processing chamber 100, where the processing region 129A is disposed between the substrate support assembly 136 and the chamber lid 123. In some embodiments, the RF signal has a frequency of about 1 MHz or greater, such as about 20 MHz or greater.

Typically, the RF signal delivered to the support base 107 establishes a first RF waveform 601 (FIGS. 6A-6B) at the bias electrode 104, which is capacitively coupled to the support base 107 through a first portion of dielectric material (e.g., dielectric material layer 105C) disposed therebetween. The bias electrode 104 is spaced apart from the processing plasma 101 by a second portion of dielectric material (e.g., the dielectric material layer 105B) and, in some embodiments, a substrate 103 disposed on a substrate support surface 105A. The substrate supporting surface 105A is formed from the second portion of dielectric material (e.g., the dielectric material layer 105B).

In some embodiments, the RF signal delivered to the support base 107 also establishes a second RF waveform 602 (FIGS. 6A-6B) at the edge control electrode 115 (second electrode), which may be capacitively coupled to the support base 107 through a third portion of dielectric material disposed therebetween. In some embodiments, such as shown in FIG. 1A, the third portion of dielectric material may be formed of the same material and have the same thickness as the first portion of dielectric material separating the bias electrode 104 from the support base 107. In some embodiments, such as shown in FIG. 9A, the third portion of dielectric material separating the edge control electrode 115 from the support base 107. In other embodiments, the third portion of dielectric material may be formed of a different dielectric material that the first portion of dielectric material and/or may be separated from the support base 107 by layers of more than one dielectric material, such as shown in FIG. 1B.

In some embodiments, the method 800 further includes electrostatically clamping the substrate 103 to the substrate support 105 by delivering a chucking voltage to the bias electrode 104 from a DC power supply 155 that is electrically coupled to the bias electrode 104 using a power delivery line 157. The chucking voltage is used to create a potential between the substrate 103 and the bias electrode 104, and thus an electrostatic attraction (chucking force) through the capacitance $C_1$ of the first portion of dielectric material disposed therebetween. In some embodiments, the method 800 further includes electrostatically clamping an edge ring 114 to the substrate support assembly 136 by delivering a chucking voltage to the edge control electrode 115 from a DC power supply 155 that is electrically coupled to the edge control electrode 115 using a power delivery line 158. In some embodiments, the method 800 includes flowing an inert gas, e.g., helium, into a gap regions disposed between the substrate 103 and the substrate supporting surface 105A and/or between the edge ring 114 and a surface of the substrate support assembly 136 to facilitate heat transfer therebetween.

At activity 804, the method 800 includes adjusting one or more characteristics of the second RF waveform 602 established at the edge control electrode 115 relative to one or more characteristics of the first RF waveform 601 established at the bias electrode 104. In some embodiments, adjusting the one or more characteristics of the second RF waveform 602 relative to the one or more characteristics of the first RF waveform 601 includes changing a voltage amplitude ratio (e.g., $V_{RF2}/V_{RF1}$) between the second RF waveform 602 and the first RF waveform 601, as shown in FIG. 6A or 6B, adjusting a current amplitude ratio between the second RF waveform 602 and the first RF waveform, adjusting a phase difference, e.g., delta $\phi$, between the second RF waveform 602 and the first RF waveform 601, adjusting a delivered power ratio between the second RF waveform 602 and the first RF waveform 601, or a combination thereof. Adjusting the one or more characteristics of the second RF waveform 602 relative to the first RF waveform 601 is performed by adjusting the electrical characteristics of one or more of the elements within the edge tuning circuit 170.

In some embodiments, adjusting the second RF waveform 602 relative to the first RF waveform 601 changes the plasma uniformity across at least a portion of the processing region 129A. For example, in one embodiment, the processing region 129A is defined by the chamber lid 123 and substrate support assembly 136, and the plasma 101 is a bulk plasma that is formed therebetween. In some embodiments, a first portion of the plasma 101 is formed in a region disposed between the chamber lid 123 and the bias electrode 104 and a second portion of the plasma 101 is formed in a region disposed between the chamber lid 123 and the edge control electrode 115. In those embodiments, adjusting the second RF waveform 602 relative to the first RF waveform 601 changes a plasma density in the second portion of the plasma 101 relative to a plasma density in the first portion of the plasma 101.

In some embodiments, adjusting the one or more characteristics of the second RF waveform 602 established at the edge control electrode 115 relative to the one or more characteristics of first RF waveform 601 established at the bias electrode 104 includes using an edge tuning circuit electrically coupled to the edge control electrode 115, such as the edge tuning circuit 170 shown in FIG. 9A and described above. In some embodiments, the edge tuning circuit 170 includes one or more variable capacitors $C_7$, $C_8$ and adjusting the one or more characteristics of the second RF waveform 602 relative to the one or more characteristics of first RF waveform 601 includes changing one or more variable capacitors $C_7$, $C_8$. Adjusting the edge tuning circuit 170 may be done automatically so that the system controller 126 adjusts the electrical characteristics of one or more components of the edge tuning circuit 170, such as the capacitance $C_7$, $C_8$, based on the desired characteristics of the RF waveforms 601, 602 and/or the desired differences therebetween. For example, in some embodiments, the system controller 126, by use of the signal detection module 187, may be configured to: determine characteristics of the respective waveforms by measuring one or more characteristics of electrical signals taken at one or more nodes N; compare the determined characteristics to desired characteristics, and, based on the comparison, change an output of a component of the edge tuning circuit 170. In some embodiments, the edge tuning circuit 170 may be adjusted manually where a user changes a set point for a component of the edge tuning circuit 170, such as the capacitance of a variable capacitor $C_7$, $C_8$ or an inductance L of the circuit. The user may change the set point using the system controller 126 and/or the signal detection module 187, e.g., by changing a recipe parameter corresponding to the component or another setting in the instructions used by the system controller 126 to operate the processing system 10A, 10B.

Generally, assuming a relatively constant RF power is provided to the support base 107 from the plasma generator assembly 163, an increase in the $V_{RF2}/V_{RF1}$ ratio, by use of the edge tuning circuit 170, will result in an increase in the ratio of plasma density near the edge of the substrate relative to a plasma density near the center of the substrate. The comparative increase in plasma density provides a corresponding increase in plasma generated species in the bulk plasma and thus a relative increase in ion flux and activated neutral gas molecule flux at the edge of the substrate surface there below. Similarly, a drop in the $V_{RF2}/V_{RF1}$ ratio will result in a drop the ratio of plasma density near the edge of the substrate to the plasma density near the center of the substrate to cause a corresponding drop in ion flux and activated neutral gas molecule flux at the edge of the substrate.

By controlling the relative plasma densities between the first and second portions of the plasma, a corresponding distribution of activated species within the processing region 129A may also be controlled and used to improve global processing non-uniformity, such as within-wafer processing non-uniformity. Advantageously, the method 800 may be implemented as a processing parameter adjustment, such as by controlling the edge tuning circuit 170 using the system controller 126 to adjust the capacitance $C_7$, $C_8$. Thus, the method 800 may be implemented without resorting to mechanical adjustments or changes in hardware configurations that are typically needed to adjust bulk plasma distribution in a capacitively coupled plasma (CCP) system and thus prevent the fine control thereof.

At activity 806, the method 800 (optionally) includes establishing pulsed voltage (PV) waveforms at one or both of the bias electrode 104 and edge control electrode 115. Here, a first PV voltage waveform may be established at the bias electrode 104 using the first PV source assembly 196, and a second PV waveform may be established at the edge control electrode 115 using a second PV source assembly 197. As discussed above, the PV waveform generators 150 can be used to establish a nearly constant sheath voltage (e.g., a nearly constant difference between the substrate potential and the plasma potential) that provides a single peak IEDF for ions accelerated towards the substrate surface and/or can be manipulated to provide a desired IEDF profile of ion energy at the substrate surface.

In some embodiments, the first and/or second PV waveforms include a series of repeating cycles, where a waveform within each cycle has a first portion that occurs during a first time interval, e.g., the sheath formation phase 451 and ion current phase 452 (FIG. 4), and a second portion that occurs during a second time interval, e.g., the sheath collapse phase 450. In some embodiments, the waveform that is established at the surface of the substrate is substantially constant during at least a portion of the second time interval, and the second time interval is longer than the first time interval. In some embodiments, the first and/or second PV waveforms each have a voltage peak in the first time interval and a substantially positive slope or a substantially negative slope during at least a portion of the second time interval. In some embodiments, the second time interval is longer than the first time interval. In other embodiments, the second time interval is shorter or about the same as the first time interval.

At activity 808, the method 800 optionally includes adjusting one or both of the first PV waveforms established at the bias electrode 104 and the second PV waveform established at the edge control electrode 115. In some embodiments, the first and second PV waveforms at the respective electrodes are independently controllable to enable fine-tuning of desired relative sheath voltages between the center and edge of the substrate, which, in turn, enables fine control of the relative ion energies at the substrate surfaces therebetween. Thus, in some embodiments, activity 808 includes adjusting one or more characteristics of the first PV waveform relative to one or more characteristics of the second PV waveform. In some embodiments, adjusting one or more characteristics includes adjusting one or a combination of the PV waveform frequency ($1/T_P$), pulse voltage level $V_{pp}$, pulse voltage on-time, of the first and/or second PV waveforms established at the bias electrode 104 and the edge control electrode 115 respectively.

The ability to independently control the first and second PV waveforms at the bias electrode 104 and the edge control electrode 115, respectively, allows for control over the directionality of the ion bombardment of the exposed surface of the substrate 103 at the edge of the substrate 103. For example, in some embodiments, the one or more characteristics may be controlled to provide a plasma sheath having a uniform thickness between the center region 103A and the edge region 103B of the substrate so that the boundary of the plasma sheath is generally parallel to the surface of the substrate 103 as it extends across the edge region. The uniform plasma sheath thickness generally results in ion incident angles normal to surface of the substrate. In some embodiments, the one or more characteristics may be controlled to bend the plasma sheath at the substrate edge, to increase or decrease the height of the sheath over the edge control electrode 115 relative to the height of the sheath over the bias electrode 104 to allow for fine tuning of the ion trajectories and ion energies at the edge region of the substrate.

Beneficially, the independent PV waveform-biasing scheme at the bias electrode 104 and edge control electrode 115 respectively may be used separately from, and/or in combination with, the plasma density uniformity and distribution controls provided by the edge tuning circuit 170. Thus, the method 800 beneficially provides for fine process control over ion energy and directionality uniformity across the substrate surface, using the PV biasing schemes as well as fine control over the plasma density uniformity and/or plasma density distribution using radio frequency (RF) edge tuning schemes.

Figure 8B:
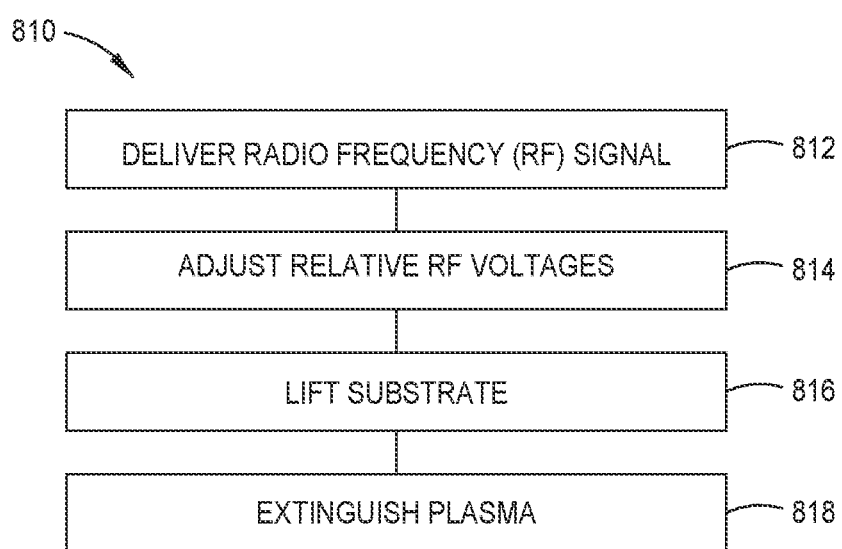
Figure 9C:
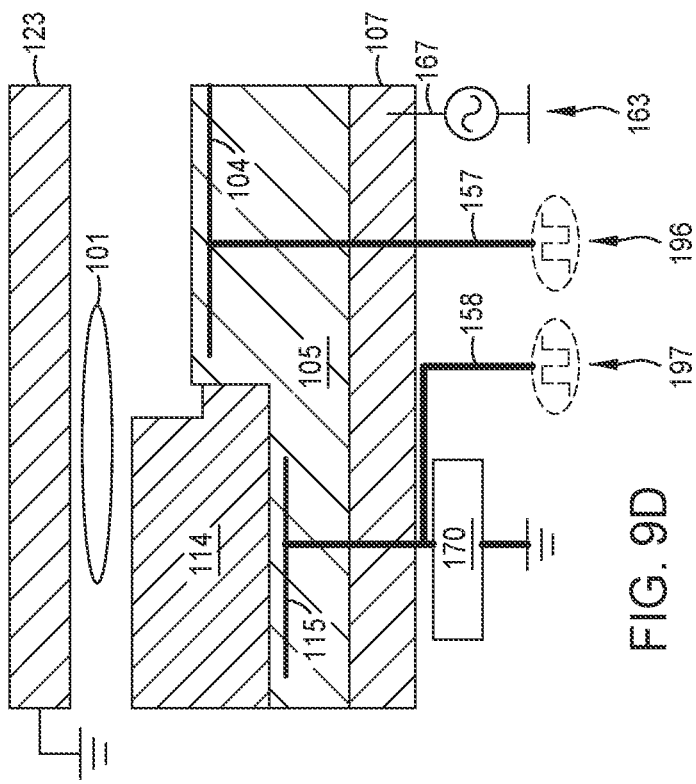

FIG. 8B is a process flow diagram illustrating a method 810 of controlling the distribution of plasma density, e.g., by use of the edge tuning circuit 170, in order to reduce particulate related defectivity at the surface of the substrate 103 and/or particulate related residues from accumulating on surfaces within the processing volume 129. Such particulate related defectivity may come from any number of sources, including process generated particles, during an etch process where material is sputtered from the substrate surface, particulate matter from surfaces within the processing volume, particulate matter introduced into the processing volume during substrate transfer, and/or particulate matter introduced into the processing volume during system maintenance. Often, such particles, shown as particulate matter 30 in FIGS. 9A-9C, are charged and remain suspended in the plasma 101 during substrate processing only to settle on the surface of the substrate 103 when the plasma 101 is extinguished. Thus, in some embodiments, the method 810 may be used to preferentially adjust the plasma density towards the peripheral edge of the substrate support assembly 136 before extinguishing the plasma 101 so that the suspended particles may be swept from a position over the substrate surface and evacuated from the processing volume 129 through the vacuum outlet 120 instead of settling on the surface of the substrate 103. The method 810 may be used in combination with the other methods described herein, e.g., the methods 800 and 820, or may be used independently therefrom.

At activity 812, the method 810 includes delivering an RF signal to the support base 107, where the RF signal is configured to ignite and/or maintain a plasma 101 formed in the processing region 129A of the processing volume 129. Here, the RF signal establishes a first RF waveform 601 at the bias electrode 104 and a second RF waveform 602 at the edge control electrode 115.

At activity 814, the method 810 includes adjusting one or both of the second RF waveform 602 and the first RF waveform 601, by adjusting the electrical characteristics of one or more of the elements within the edge tuning circuit 170, to increase the plasma density in the portion of the plasma formed over the edge control electrode 115 relative to the plasma density in the portion of the plasma formed over the bias electrode 104, such as shown in FIG. 9B. Increasing the plasma density over the edge control electrode 115 relative to the plasma density over the bias electrode 104 moves the particles suspended in the central portion of the plasma radially outward towards the peripheral edge of the substrate support assembly 136.

At activity 816, the method 810 includes lifting the substrate 103 from substrate supporting surface 105A, such as by use of the plurality of pins 20. Typically, lifting the substrate 103 from the substrate supporting surface 105A includes de-chucking the substrate by stopping delivery of a chucking voltage to the bias electrode 104, and thus stopping the generation of the electrostatic chucking force between the substrate 103 and the bias electrode 104, before extending the plurality of pins 20 to extend the substrate above the substrate supporting surface 105A. In some embodiments, the substrate 103 is lifted from the substrate supporting surface 105A before activity 814. In some embodiments, a flow of helium into the gap region 105D (FIG. 1C) is stopped or reduced before the substrate 103 is de-chucked. In other embodiments, the flow of helium is continued as the substrate 103 is lifted from the substrate supporting surface 105A in order to remove, e.g., blow, particulate matter outward from the region disposed between the circumferential edge of the substrate 103 and the radially inward-facing surfaces of the edge ring 114. In some embodiments, the flowrates of process gases flowing into the chamber and/or the vacuum provided by the vacuum pump may be adjusted to increase the radial flow in the chamber to blow or transport particulate matter radially outward from the substrate surface.

At activity 818, the method 810 includes extinguishing the processing plasma 101, e.g., by stopping delivery of the RF signal to the support base 107 and transferring the substrate 103 from the processing volume 129. In some embodiments, the plasma is extinguished before the substrate 103 is lifted from the substrate supporting surface 105A at activity 816. Beneficially, preferentially adjusting the plasma density towards the peripheral edge of the substrate 103 by adjusting the electrical characteristics of one or more of the elements within the edge tuning circuit 170 to move the suspended particulate matter 30 radially outward towards the one or more sidewalls 122 of the processing region 129A where they may be evacuated from the processing volume 129 through the vacuum outlet 120 and/or are at least less likely to settle on the surface of the substrate 103 when the processing plasma 101 is extinguished, such as shown in FIG. 9C.

Figure 8C:
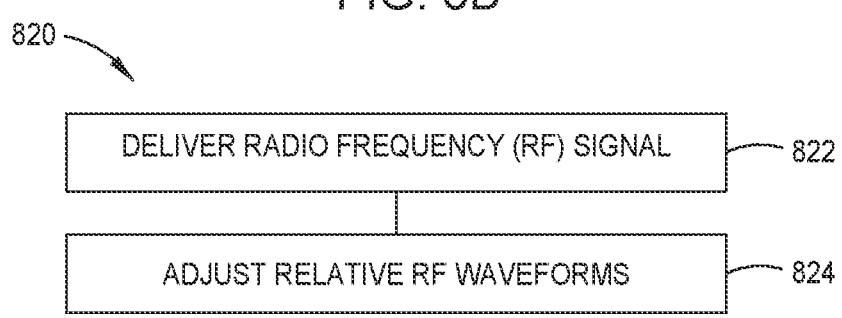
Figure 9D:
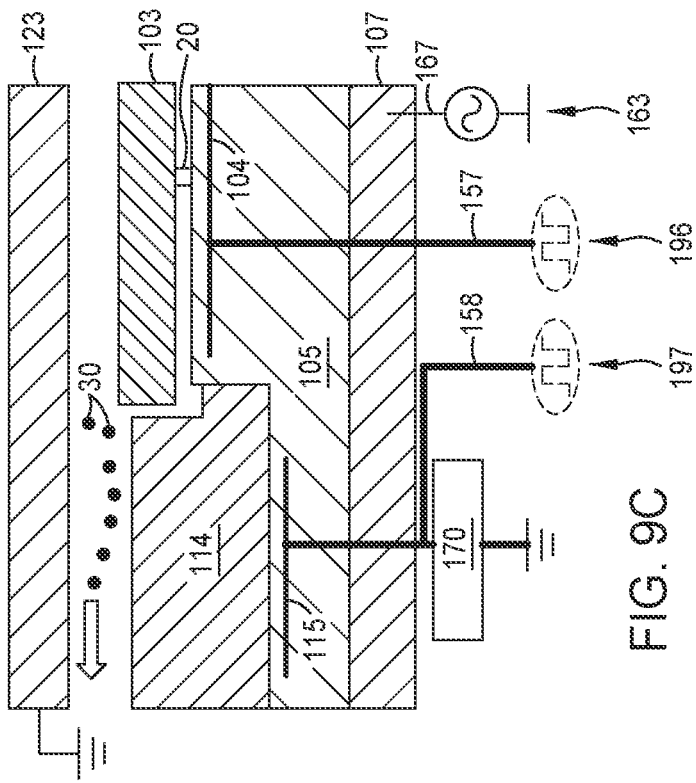

FIG. 8C is a process flow diagram illustrating an in-situ plasma chamber cleaning method, here the method 820, which may be used to clean accumulated processing byproducts from the edge ring 114, and/or the portions of the substrate supporting surface 105A adjacent thereto while reducing in-situ plasma-based damage to the central region of the substrate supporting surface 105A. As shown in FIG. 9D, the method 820 may be performed between substrate processing, e.g., without a substrate positioned on the substrate support 105.

At activity 822, the method 820 includes delivering a radio frequency (RF) signal to the support base 107 to ignite and maintain a plasma 101 in the processing region 129A. The processing plasma 101, as shown in FIG. 9D, is an in-situ cleaning plasma which may be formed of one or more cleaning gases flowed into the processing region 129A through the gas inlet 128. In some embodiments, the cleaning gases include a halogen-based gas, e.g., a fluorine and/or chlorine based gas, and oxidative gas, e.g. an oxygen based gas. Generally, the radical species of the plasma-activated cleaning gases react with processing byproducts that have accumulated on surfaces within the processing volume 129 to form a volatile reaction product which can then be evacuated through processing volume 129 through the vacuum outlet 120.

At activity 824, the method 820 includes preferentially adjusting the plasma density towards the portion of the plasma 101 formed over the edge control electrode 115 relative to the plasma density of the portion of the plasma formed over the bias electrode 104 by adjusting the electrical characteristics of one or more of the elements within the edge tuning circuit 170. Preferentially adjusting the plasma density increased the flux of cleaning gas radicals at the surface of the edge ring 114 and the radially adjacent portions of the substrate supporting surface 105A, e.g., the portions of the substrate support assembly 136 that define a circumference gap between a substrate 103 and the edge ring 114 and during substrate processing. This gap accumulates processing byproduct residues faster than the other portions of the substrate supporting surface 105A, which are not exposed during plasma processing due to the positioning of the substrate 103 thereon. Thus, the method 820 may be used to concentrate cleaning gas radicals in the regions having the higher accumulation of processing byproduct residues while simultaneously reducing ion flux, and thus ion-based damage, such as erosion, of the dielectric material forming the larger central portion of the substrate supporting surface 105A.

The above-described embodiments may be used alone or in combination to provide fine control over the generation and distribution of activated species within a processing region of a capacitively coupled plasma (CCP) chamber. Beneficially, the embodiments may be performed by use of a system controller without adjusting or modifying individual chamber components, thus providing a processing recipe parameter that can easily be adjusted during processing of a single substrate and/or between sequentially processed substrate. The RF plasma density control methods may be implemented independently and/or in combination with the pulsed voltage (PV) waveform biasing methods to provide independent and fine control over ion energy, IEDF, ion directionality, ion flux, and activated neutral gas molecule flux at the substrate surface when compared to a conventional RF biased CCP system.

While the foregoing is directed to embodiments of the present disclosure, other and further embodiments of the disclosure may be devised without departing from the basic scope thereof, and the scope thereof is determined by the claims that follow.

What is claimed is:

1. A plasma processing system, comprising:
   a substrate support assembly, comprising:
   a support base;
   a first electrode that is disposed over the support base and is spaced apart from the support base by a first portion of dielectric material;
   a second portion of dielectric material disposed over the first electrode, the second portion of dielectric material forming a substrate supporting surface; and
   a second electrode that is disposed a distance from a center of the first electrode and is spaced apart from the support base by a third portion of dielectric material;
   one or more pulsed voltage waveform generators electrically coupled to the first and second electrodes;
   a radio frequency (RF) generator electrically coupled to the support base, wherein:
   the RF generator is configured to deliver an RF signal to the support base, and
   the RF signal establishes a first RF waveform at the first electrode; and
   an edge tuning circuit electrically coupled to the second electrode, wherein the edge tuning circuit is configured to adjust one or more characteristics of a second RF waveform established at the second electrode relative to one or more characteristics of the first RF waveform established at the first electrode;
   a first transmission line electrically coupling a first pulsed voltage waveform generator of the one or more pulsed voltage waveform generators to the first electrode;
   a first clamping network comprising a first direct-current (DC) voltage source and a first blocking capacitor, wherein the first DC voltage source is electrically coupled between a first point of the first transmission line and ground, the first point of the first transmission line between the first pulsed waveform generator and the first electrode;
   a second transmission line electrically coupling a second pulsed voltage waveform generator of the one or more pulsed voltage waveform generators to the second electrode; and
   a second clamping network comprising a second direct-current (DC) voltage source and a second blocking capacitor, wherein the second DC voltage source is electrically coupled between a second point of the second transmission line and ground, the second point of the second transmission line between the second pulsed waveform generator and the second electrode.

2. The plasma processing system of claim 1, wherein the edge tuning circuit is configured to adjust the one or more characteristics of the second RF waveform relative to the one or more characteristics of the first RF waveform by changing one or a combination of:
   (a) a voltage amplitude ratio between the second RF waveform at the second electrode and the first RF waveform at the first electrode;
   (b) a phase difference between the second RF waveform at the second electrode and the first RF waveform at the first electrode; and
   (c) a power ratio between the second RF waveform at the second electrode and the first RF waveform at the first electrode.

3. The plasma processing system of claim 1, wherein the RF signal delivered by the RF generator is configured to ignite and maintain a plasma from gases or vapors delivered to a processing region of a processing chamber.

4. The plasma processing system of claim 3, wherein the RF generator is configured to deliver the RF signal at a frequency of about 1 MHz or greater.

5. The plasma processing system of claim 4, wherein the RF generator is configured to deliver the RF signal at a frequency of about 20 MHz or greater.

6. The plasma processing system of claim 1, wherein the substrate support assembly is configured to establish the second RF waveform at the second electrode by capacitively coupling the second electrode to the support base through the third portion of dielectric material.

7. The plasma processing system of claim 6, wherein a conductive edge ring is capacitively coupled to the second electrode.

8. The plasma processing system of claim 7, further comprising a processing chamber, comprising:
   a chamber lid, one or more chamber walls, and a chamber base that collectively define a processing volume, wherein
   the processing chamber is configured to ignite and maintain a plasma of gases or vapors delivered to a processing region through capacitively coupling the plasma to the chamber lid and the substrate support assembly.

9. The plasma processing system of claim 1, further comprising:
   a chamber lid and one or more chamber walls, wherein the chamber lid faces the substrate support assembly and the chamber lid, the one or more chamber walls, and the substrate support assembly collectively define a processing region;
   a system controller comprising memory and a processor; and
   computer-implemented instructions stored in the memory which, when executed by the processor, are configured to perform a method of processing a substrate, comprising:
   (i) igniting and maintaining a plasma from gases or vapors delivered to the processing region, wherein a first portion of the plasma is formed between the chamber lid and the first electrode, and a second portion of the plasma is formed between the chamber lid and the second electrode; and
   (ii) adjusting, by use of the edge tuning circuit, one or more characteristics of the second RF waveform relative to one or more characteristics of the first RF waveform to change a ratio of a plasma density in the second portion of the plasma to a plasma density in the first portion of the plasma, wherein the respective plasma densities each comprise a number of free electrons per $cm^3$ of the first and second portions of the plasma.

10. The plasma processing system of claim 9, wherein adjusting the one or more characteristics of the second RF waveform relative to the one or more characteristics of the first RF waveform increases the plasma density in the second portion of the plasma relative to the plasma density in the first portion of the plasma, and the method further comprises:
 (iii) before or after (ii), lifting the substrate from the substrate support surface; and
 (iv) after (iii), extinguishing the plasma.

11. The plasma processing system of claim 1, wherein the edge tuning circuit is electrically coupled between the second electrode and ground.

12. The plasma processing system of claim 1, wherein the edge tuning circuit is electrically coupled between the second electrode and the RF generator.

13. The plasma processing system of claim 1, wherein the edge tuning circuit is electrically coupled to the second electrode, ground, and the RF generator.

14. The plasma processing system of claim 1, wherein
 the one or more pulsed voltage waveform generators are configured to establish respective first and second pulsed voltage waveforms at the first and second electrodes,
 the first and second pulsed voltage waveforms each comprise a series of repeating cycles, and a waveform within each repeating cycle has a first portion that occurs during a first time interval and a second portion that occurs during a second time interval,
 the waveform has a voltage peak in the first time interval, and
 the waveform has a substantially positive slope, a substantially negative slope, or is substantially constant during at least a portion of the second time interval.

15. The plasma processing system of claim 1, wherein
 the first blocking capacitor is disposed on the first transmission line between the first pulsed waveform generator and the first point of the first transmission line, and
 the second blocking capacitor is disposed on the second transmission line between the second pulsed waveform generator and the second point of the second transmission line.

16. A plasma processing system, comprising:
 a processing chamber comprising a chamber lid, one or more chamber walls, and a substrate support assembly that collectively define a processing region, the substrate support assembly comprising:
  a support base;
  a first electrode that is disposed over the support base and is spaced apart from the support base by a first portion of dielectric material;
  a second portion of dielectric material disposed over the first electrode, the second portion of dielectric material forming a substrate supporting surface; and
  a second electrode that is disposed a distance from a center of the first electrode and is spaced apart from the support base by a third portion of dielectric material;
 a radio frequency (RF) generator electrically coupled to the support base, wherein:
  the RF generator is configured to deliver an RF signal to the support base,
  the RF signal is configured to ignite and maintain a plasma or gases or vapors delivered to the processing region, and
  the RF signal establishes a first RF waveform at the first electrode; and
 an edge tuning circuit electrically coupled to the second electrode, wherein the edge tuning circuit is configured to adjust one or more characteristics of a second RF waveform established at the second electrode relative to one or more characteristics of the first RF waveform established at the first electrode;
 a first transmission line electrically coupling a first pulsed voltage waveform generator of the one or more pulsed voltage waveform generators to the first electrode;
 a first clamping network comprising a first direct-current (DC) voltage source and a first blocking capacitor, wherein the first DC voltage source is electrically coupled between a first point of the first transmission line and ground, the first point of the first transmission line between the first pulsed waveform generator and the first electrode;
 a second transmission line electrically coupling a second pulsed voltage waveform generator of the one or more pulsed voltage waveform generators to the second electrode; and
 a second clamping network comprising a second direct-current (DC) voltage source and a second blocking capacitor, wherein the second DC voltage source is electrically coupled between a second point of the second transmission line and ground, the second point of the second transmission line between the second pulsed waveform generator and the second electrode.

17. The plasma processing system of claim 16, wherein the edge tuning circuit is configured to adjust the second RF waveform relative to the first RF waveform by changing one of:
 (a) a voltage amplitude ratio between the second RF waveform at the second electrode and the first RF waveform at the first electrode;
 (b) a current amplitude ratio between the second RF waveform and the first RF waveform;
 (c) a phase difference between the second RF waveform at the second electrode and the first RF waveform at the first electrode;
 (d) a power ratio between the second RF waveform and the first RF waveform; or
 (e) a combination of (a), (b), (c) or (d).

18. The plasma processing system of claim 16, wherein the RF generator is configured to deliver the RF signal at a frequency of about 1 MHz or greater.

19. The plasma processing system of claim 18, wherein the RF generator is configured to deliver the RF signal at a frequency of about 20 MHz or greater.

20. The plasma processing system of claim 16, further comprising:
 a system controller comprising memory and a processor; and
 computer-implemented instructions stored in the memory which, when executed by the processor, are configured to perform a method of processing a substrate, comprising:
  (i) igniting and maintaining a plasma from gases or vapors delivered to the processing region, wherein a first portion of the plasma is formed between the chamber lid and the first electrode and a second portion of the plasma is formed between the chamber lid and the second electrode; and
  (ii) adjusting, by use of the edge tuning circuit, one or more characteristics of the second RF waveform relative to one or more characteristics of the first RF waveform to change a ratio of a plasma density in the second portion of the plasma to a plasma density in the first portion of the plasma, wherein the respective plasma densities each comprise a number of free electrons per cm$^3$ of the first and second portions of the plasma.

21. The plasma processing system of claim 20, wherein adjusting the one or more characteristics of the second RF waveform relative to the one or more characteristics of the first RF waveform increases the plasma density in the second portion of the plasma relative to the plasma density in the first portion of the plasma, and the method further comprises:
   (iii) before or after (ii), lifting the substrate from the substrate support surface; and
   (iv) after (iii), extinguishing the plasma.

22. The plasma processing system of claim 20, wherein the plasma is a cleaning plasma formed of one or more cleaning gases, adjusting the second RF waveform relative to the first RF waveform increases the plasma density in the second portion of the cleaning plasma relative to the plasma density in the first portion of the cleaning plasma, and the method further comprises exposing surfaces of the substrate support assembly to the cleaning plasma to remove processing byproducts therefrom.

23. The plasma processing system of claim 16, wherein the first blocking capacitor is disposed on the first transmission line between the first pulsed waveform generator and the first point of the first transmission line, and the second blocking capacitor is disposed on the second transmission line between the second pulsed waveform generator and the second point of the second transmission line.

* * * * *